(12) United States Patent
Lee et al.

(10) Patent No.: US 11,922,714 B2
(45) Date of Patent: Mar. 5, 2024

(54) DISPLAY DEVICE COMPRISING FINGERPRINT RECOGNITION SENSOR LAYERS

(71) Applicant: Samsung Display Co., Ltd., Yongin-si (KR)

(72) Inventors: Jong Hyun Lee, Cheonan-si (KR); Ji Hun Ryu, Hwaseong-si (KR); Il Nam Kim, Hwaseong-si (KR); Jong In Baek, Hwaseong-si (KR); Eun Jin Sung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 104 days.

(21) Appl. No.: 16/931,159

(22) Filed: Jul. 16, 2020

(65) Prior Publication Data

US 2021/0034832 A1 Feb. 4, 2021

(30) Foreign Application Priority Data

Jul. 29, 2019 (KR) .................. 10-2019-0091658

(51) Int. Cl.
*G06V 40/13* (2022.01)
*H10K 50/84* (2023.01)
*H10K 59/12* (2023.01)
*H10K 59/65* (2023.01)
*G02B 5/20* (2006.01)
*H01L 27/146* (2006.01)

(52) U.S. Cl.
CPC ....... *G06V 40/1318* (2022.01); *H10K 50/841* (2023.02); *H10K 59/12* (2023.02); *H10K 59/65* (2023.02); *G02B 5/208* (2013.01); *H01L 27/14623* (2013.01); *H01L 27/14678* (2013.01)

(58) Field of Classification Search
CPC ............. G06K 9/0004; G06K 9/00046; G06K 9/0006; G06V 40/1318; G06V 40/12; H01L 27/3227; H01L 27/3234
See application file for complete search history.

(56) References Cited

U.S. PATENT DOCUMENTS

| 9,225,888 | B2 | 12/2015 | Huang |
| 9,438,778 | B2 | 9/2016 | Chang et al. |
| 2002/0090507 | A1* | 7/2002 | Barth ............... B32B 17/10633 |
| | | | 427/508 |

(Continued)

FOREIGN PATENT DOCUMENTS

| EP | 3462498 A1 | 4/2019 |
| EP | 3514726 A1 | 7/2019 |
| KR | 10-2018-0100140 A | 9/2018 |

*Primary Examiner* — Yuzhen Shen
(74) *Attorney, Agent, or Firm* — Lewis Roca Rothgerber Christie LLP

(57) ABSTRACT

Provided is a display device. The display device includes a display panel which includes a base substrate, a thin-film transistor layer on the base substrate, and a light emitting element layer comprising light emitting elements on the thin-film transistor layer; a cover window on the light emitting element layer of the display panel; and a fingerprint recognition sensor layer under the display panel. The base substrate includes a first base, a second base on the first base, and a light blocking layer between the first base and the second base, and the light blocking layer includes holes through which light reflected by a finger touching the cover window passes.

25 Claims, 21 Drawing Sheets

(56) References Cited

U.S. PATENT DOCUMENTS

| | | | |
|---|---|---|---|
| 2011/0050588 A1* | 3/2011 | Li | G06F 3/04883 |
| | | | 345/173 |
| 2016/0300901 A1* | 10/2016 | Hsu | G02F 1/133514 |
| 2017/0249494 A1 | 8/2017 | Zhang et al. | |
| 2017/0351898 A1 | 12/2017 | Zhang | |
| 2017/0372113 A1* | 12/2017 | Zhang | H01L 27/3244 |
| 2018/0033835 A1* | 2/2018 | Zeng | G06V 40/1318 |
| 2018/0069048 A1* | 3/2018 | Wu | H10K 59/65 |
| 2019/0095574 A1 | 3/2019 | Ko et al. | |
| 2019/0180072 A1* | 6/2019 | Fomani | G06V 40/1324 |
| 2019/0197286 A1 | 6/2019 | Kim et al. | |
| 2019/0220121 A1 | 7/2019 | Kim et al. | |
| 2019/0220649 A1* | 7/2019 | Zhu | G06V 40/1318 |
| 2019/0251326 A1* | 8/2019 | Sun | G06V 40/1324 |
| 2019/0303641 A1 | 10/2019 | Ko et al. | |
| 2020/0059578 A1* | 2/2020 | Lee | G06V 40/1318 |
| 2020/0242319 A1* | 7/2020 | Zeng | G06V 40/1318 |
| 2020/0343311 A1* | 10/2020 | Li | H10K 59/40 |
| 2021/0066397 A1* | 3/2021 | Xiao | H01L 27/3234 |

\* cited by examiner

DISPLAY DEVICE COMPRISING FINGERPRINT RECOGNITION SENSOR LAYERS

CROSS-REFERENCE TO RELATED APPLICATION

This application claims priority to and the benefit of Korean Patent Application No. 10-2019-0091658, filed on Jul. 29, 2019, in the Korean Intellectual Property Office, the entire content of which is incorporated herein by reference.

BACKGROUND

1. Field

Embodiments of the present disclosure relate to a display device.

2. Description of the Related Art

Display devices are becoming increasingly important with the development of multimedia. Accordingly, various types of display devices such as liquid crystal display devices and organic light emitting display devices are being used.

Of these display devices, organic light emitting display devices display images using organic light emitting diodes (OLEDs) that generate light through recombination of electrons and holes. The organic light emitting display devices have features of fast response speed, high luminance, wide viewing angle, and low power consumption.

Recently, research and development have been conducted on a technology for integrating a fingerprint recognition sensor into a display panel, which is the component that occupies the largest area in a portable information communication device.

SUMMARY

Aspects of embodiments of the present disclosure provide a display device that can implement a fingerprint recognition sensor without a separate or external light source.

Aspects of embodiments of the present disclosure also provide a display device with improved fingerprint recognition characteristics.

However, aspects of the present disclosure are not restricted to the ones set forth herein. The above and other aspects of embodiments of the present disclosure will become more apparent to one of ordinary skill in the art to which the present disclosure pertains by referencing the detailed description of the present disclosure given below.

An embodiment of a display device includes: a display panel including a base substrate, a thin-film transistor layer on the base substrate, and a light emitting element layer including light emitting elements on the thin-film transistor layer; a cover window on the light emitting element layer of the display panel; and a fingerprint recognition sensor layer under the display panel, wherein the base substrate includes a first base, a second base on the first base and a light blocking layer between the first base and the second base, and wherein the light blocking layer includes holes through which light reflected by a finger touching the cover window passes.

BRIEF DESCRIPTION OF THE DRAWINGS

These and/or other aspects of embodiments of the present disclosure will become apparent and more readily appreciated from the following description of the embodiments, taken in conjunction with the accompanying drawings in which.

DETAILED DESCRIPTION

The subject matter of the present disclosure will now be described more fully hereinafter with reference to the accompanying drawings, in which embodiments of the present disclosure are shown. The subject matter of the present disclosure may, however, be embodied in different forms and should not be construed as limited to the embodiments set forth herein. Rather, these embodiments are provided so that this disclosure will be thorough and complete, and will filly convey the scope of the subject matter of the present disclosure to those skilled in the art. The same reference numbers indicate the same components throughout the specification. In the attached figures, the thickness of layers and regions may be exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the spirit and scope of the present disclosure.

Hereinafter, embodiments of the present disclosure will be described with reference to the attached drawings.

Figure 1:
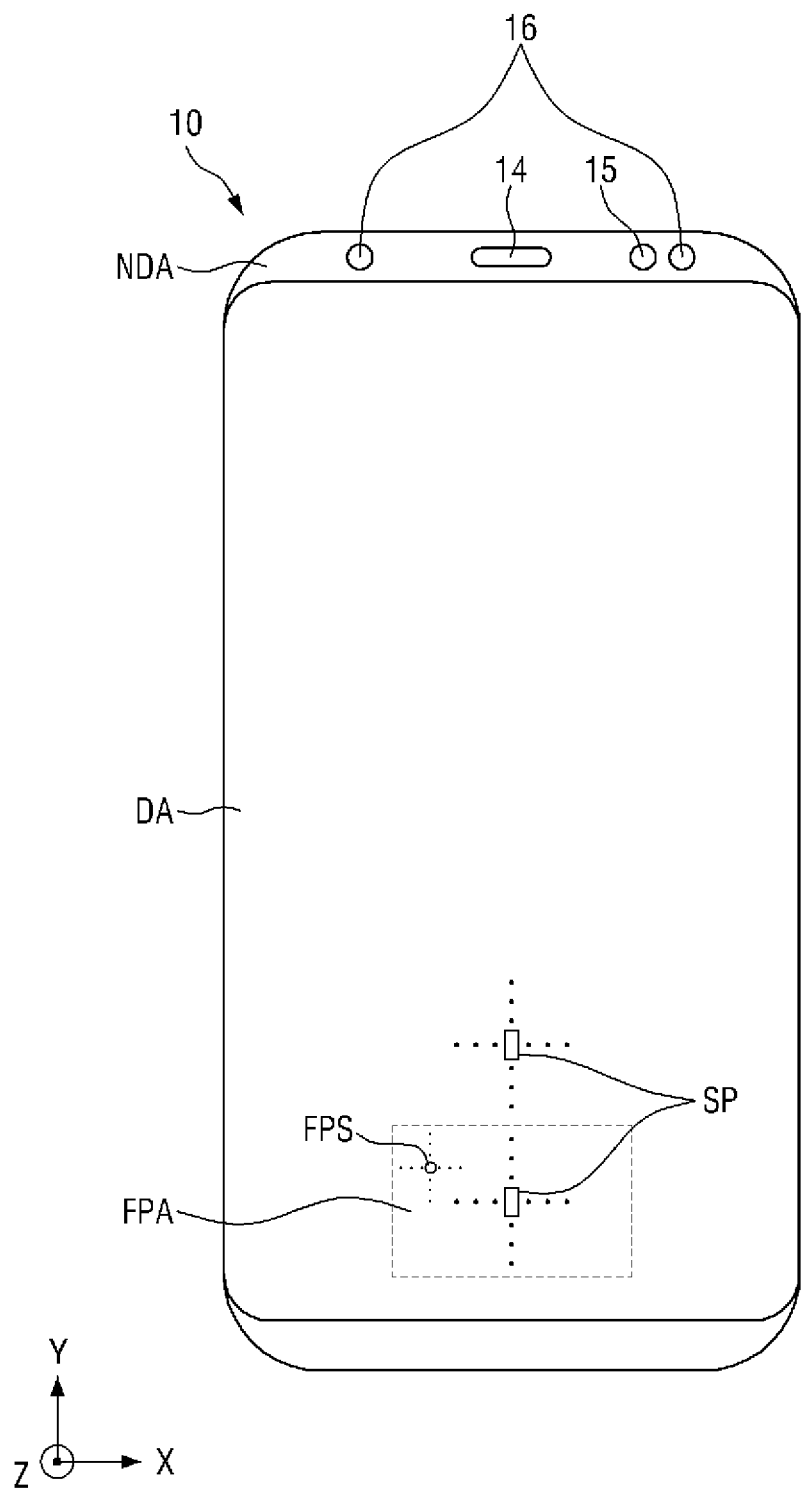
FIGS. 1 and 2 are schematic plan views of a display device according to an embodiment.
Figure 2:
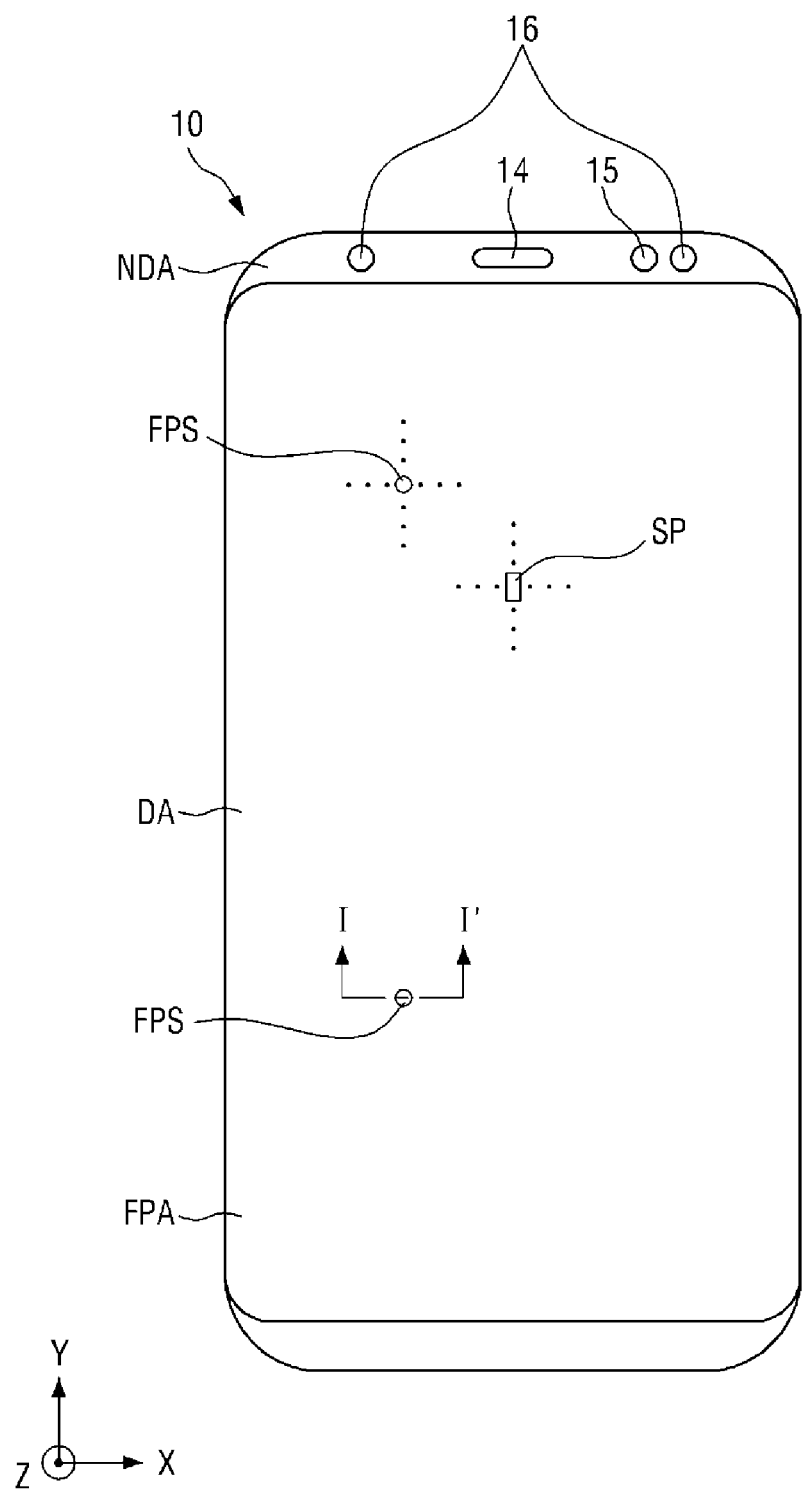

FIGS. 1 and 2 are schematic plan views of a display device 10 according to an embodiment.

Referring to FIG. 1, the display device 10 according to the embodiment may be divided into a display area DA and a non-display area NDA.

The display area DA is defined as an area where an image is displayed, and a plurality of subpixels SP are in the display area DA. In addition, the display area DA may be used as a detection member for detecting an external environment. In an embodiment, at least a portion of the display area DA may be a fingerprint recognition area FPA for recognizing a user's fingerprint. In some embodiments, the fingerprint recognition area FPA may include a plurality of subpixels SP and a plurality of fingerprint recognition sensors FPS. For example, the fingerprint recognition area FPA may display an image and may be used as an area for recognizing a user's fingerprint when the user's fingerprint needs to be recognized. In some embodiments, the subpixels SP and the fingerprint recognition sensors FPS may overlap in a third direction (Z-axis direction). In some embodiments, in some embodiments, the subpixels SP and the fingerprint recognition sensors FPS may not overlap in the third direction (Z-axis direction), or only some of the subpixels SP may overlap the fingerprint recognition sensors FPS in the third direction (Z-axis direction).

The non-display area NDA is outside the display area DA and defined as an area where no image is displayed. A speaker module 14, a camera module 15, and a sensor module 16 may be in the non-display area NDA. In an embodiment, the sensor module 16 may include at least one of an illuminance sensor, a proximity sensor, an infrared sensor, and an ultrasonic sensor. In an embodiment, the sensor module 16 may also perform a function of recognizing a user's iris. The arrangement of the speaker module 14, the camera module 15, and the sensor module 16 is not limited to the arrangement illustrated in FIG. 1. In some embodiments, at least one of the speaker module 14, the camera module 15, and the sensor module 16 may be in the display area DA. In this case, because the display area DA is widened, a sense of immersion in images can be provided to a user.

The display area DA may have a flat shape in an embodiment. However, at least a portion of the display area DA may also be bent. In addition, the display area DA may be in an edge area of the display device 10.

Referring to FIG. 2, the fingerprint recognition area FPA may be formed in substantially the same area as the display area DA. For example, the display area DA and the fingerprint recognition area FPA may coincide. In this case, a fingerprint recognition function may be provided in the entire (e.g. substantially the entire) display area DA.

Each of the fingerprint recognition sensors FPS may use a light emitting element included in at least one nearby subpixel SP as a light source for fingerprint recognition. To this end, each of the fingerprint recognition sensors FPS may be adjacent to at least one subpixel SP. However, embodiments are not limited to this case, and at least a portion of each of the fingerprint recognition sensors FPS may also overlap one pixel PXL.

In the display device 10 according to the embodiment, because the fingerprint sensor area FPA including a plurality of fingerprint recognition sensors FPS is provided in the display area DA, the fingerprint recognition function can be provided in the display area DA. In addition, because the display area 10 according to the embodiment recognizes a user's fingerprint using light emitted from the subpixels SP, the fingerprint recognition function can be implemented without a separate or external light source (e.g., a light source separate from the subpixels). Accordingly, a thickness of the display device 10 having the fingerprint recognition function can be reduced, and manufacturing costs can be reduced.

Although a case where the fingerprint recognition area FPA is in the entire (e.g. substantially the entire) display area DA is described herein below, embodiments are not limited to this case.

Figure 3:
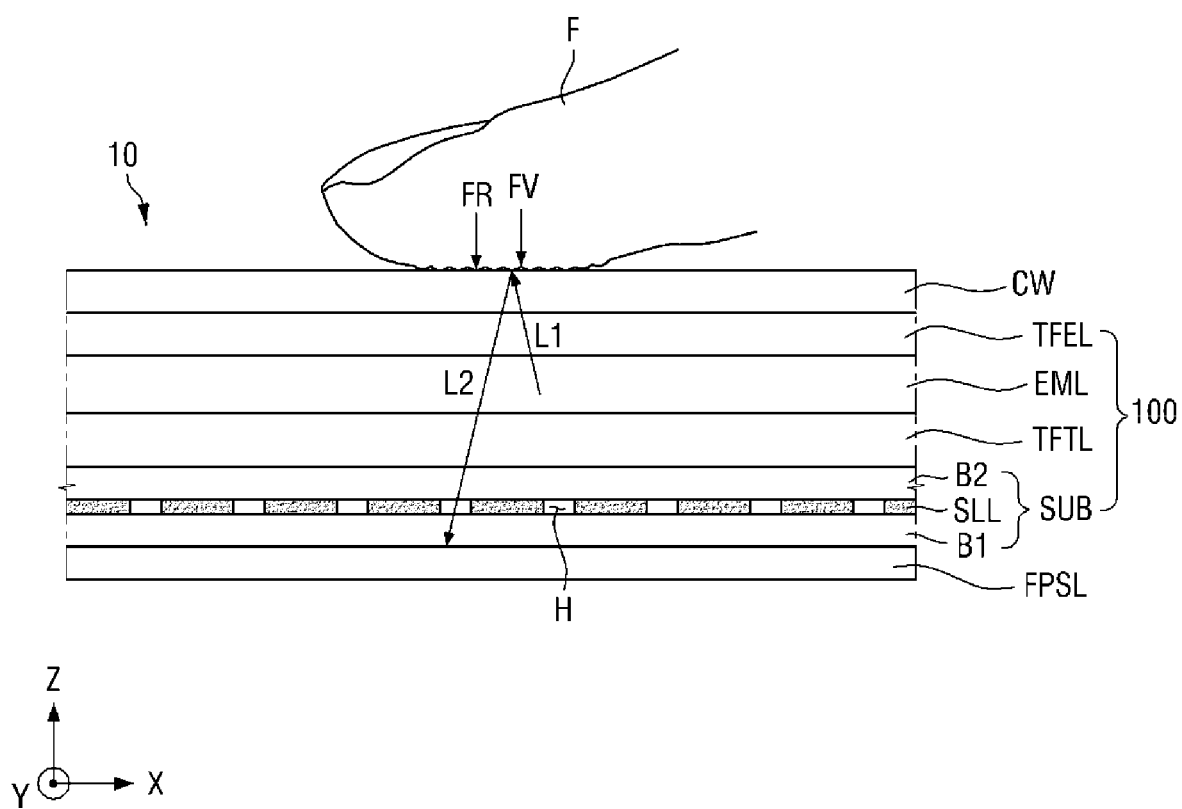
FIG. 3 is a schematic cross-sectional view of the display device according to the embodiment.

FIG. 3 is a schematic cross-sectional view of the display device 10 according to the embodiment.

Referring to FIG. 3, the display device 10 may include a display panel 100, a cover window CW, and a fingerprint recognition sensor layer FPSL.

The display panel 100 may include a base substrate SUB, a thin-film transistor layer TFTL on the base substrate SUB, a light emitting element layer EML on the thin-film transistor layer TFTL, and a thin-film encapsulation layer TFEL.

The base substrate SUB may include a first base B1, a second base B2 on the first base B1, and a light blocking layer SLL between the first base B1 and the second base B2.

Each of the first base B1 and the second base B2 may be made of an insulating material such as a polymer resin. The polymer material (e.g., the polymer resin) may be, for example, polyethersulfone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination of the same.

Each of the first base B1 and the second base B2 may be a rigid substrate or a flexible substrate that can be bent, folded, and/or rolled. When the substrate SUB or each of the first base B1 and the second base B2 is a flexible substrate, it may be made of, but not limited to, polyimide (PI).

The light blocking layer SLL may be a single layer or a multilayer made of any one or more selected from molybdenum (Mo), aluminum (Al), chromium (Cr), gold (Au), titanium (Ti), nickel (Ni), neodymium (Nd), copper (Cu), and alloys of the same. However, embodiments are not limited to this case, and, in some embodiments, the light blocking layer SLL may be made of a black matrix or may be made of various suitable materials having light blocking properties or a light absorbing material that absorbs light.

The light blocking layer SLL may include a hole H. The hole H may be a physical hole or a through hole penetrating both surfaces of the light blocking layer SLL. The hole H may be an optical passage through which light (L2) reflected by a user's fingerprint after being output (L1) from the light emitting element layer EML travels toward the fingerprint recognition sensors FPS. In some embodiments, the hole H may not be filled with the material that forms the first base B1 or the material that forms the second base B2. For example, a space inside the hole H may be empty. In some embodiments, the hole H may be filled with an optically clear material (e.g., a material that transmits visible light). For example, a portion of the material that forms the second base B2 may fill the hole H in a process of forming the second base B2 on the light blocking layer SLL. Even in this case, if the material that forms the second base B2 is an optically clear material, the hole H may serve as an optical passage through which light (L2) reflected by a user's fingerprint after being output (L1) from the light emitting element layer EML travels toward the fingerprint recognition sensors FPS.

The hole H may be in plural numbers in the light blocking layer SLL. For example, the hole H may include a plurality of holes spaced apart from each other in a first direction (X-axis direction) and a second direction (Y-axis direction). The sizes and arrangement of the holes H will be described in more detail herein below.

The thin-film transistor layer TFTL may be on the second base B2. Respective thin-film transistors of the subpixels SP may be in the thin-film transistor layer TFTL. Each of the thin-film transistors may include a gate electrode, a semiconductor layer, a source electrode, and a drain electrode.

The light emitting element layer EML may be on the thin-film transistor layer TFTL. The light emitting element layer EML may include light emitting elements, each including a first electrode, a light emitting layer, and a second electrode. In addition, the light emitting element layer EML may include a pixel defining layer for defining the subpixels SP. The light emitting layer may be, but is not limited to, an organic light emitting layer including an organic material. In an example in which the light emitting layer is an organic light emitting layer, when a set (e.g., predetermined) voltage is applied to the first electrode and a cathode voltage is applied to the second electrode through a thin-film transistor of the thin-film transistor layer TFTL, holes and electrons move to the organic light emitting layer through a hole transport layer and an electron transport layer, respectively, and combine together in the organic light emitting layer to emit light.

The thin-film encapsulation layer TFEL may be on the light emitting element layer EML. The thin-film encapsulation layer TFEL prevents or reduces the penetration of oxygen and/or moisture into the light emitting element layer EML.

The cover window CW may be on the display panel 100. For example, the cover window CW may be on the thin-film encapsulation layer TFEL of the display panel 100. In this case, the cover window CW may be attached to the thin-film encapsulation layer TFEL by a transparent adhesive member such as an optically clear adhesive (OCA) film. The cover window CW may be directly touched by a user's finger F.

In some embodiments, a touch sensor may be between the thin-film encapsulation layer TFEL and the cover window CW. In some embodiments, the touch sensor may include a touch electrode and a touch wiring coupled to the touch electrode.

The fingerprint recognition sensor layer FPSL may be under the display panel 100. For example, the fingerprint recognition sensor layer FPSL may be under the first base B1. Here, as used herein, the term "under the first base B1" refers to a side opposite to a side of the first base B1 on which the light blocking layer SLL is located.

The fingerprint recognition sensor layer FPSL may include the fingerprint recognition sensors FPS illustrated in FIG. 2. In addition, the fingerprint recognition sensor layer FPSL may be in the form of an array of the fingerprint recognition sensors FPS. The fingerprint recognition sensors FPS included in the fingerprint recognition sensor layer FPSL may be optical sensors. For example, the fingerprint recognition sensors FPS may be photodiodes, complementary metal-oxide-semiconductor (CMOS) image sensors, or charge-coupled device (CCD) image sensors.

When the user's finger F touches the cover window CW, light L1 output from the light emitting element layer EML is reflected by ridges FR or valleys FV of the user's finger F. Of the reflected light L2, components that pass through the holes H are provided to the fingerprint recognition sensors FPS of the fingerprint recognition sensor layer FPSL under the base substrate SUB. The fingerprint recognition sensors FPS which are optical sensors may convert the reflected light L2 into electrical signals and may recognize the user's fingerprint patterns from the electrical signals. Of the reflected light L2, components that do not pass through the holes H are blocked by the light blocking layer SLL. For example, the holes H may provide only components required for fingerprint recognition to the fingerprint recognition sensors FPS. Although the display panel 100 and the fingerprint recognition sensor layer FPSL are illustrated as separate elements in FIG. 3, this is only an example, and the fingerprint recognition sensor layer FPSL may also be an element of the display panel 100.

When the fingerprint recognition sensor layer FPSL is under the display panel 100 as described herein above, a process of manufacturing can be simplified, and the fingerprint recognition sensors FPS and the fingerprint recognition area FPA can be easily aligned. In addition, because the fingerprint recognition sensors FPS are not above a path along which light is output (above the light emitting element layer EML), a reduction in resolution can be prevented or reduced.

Figure 4:
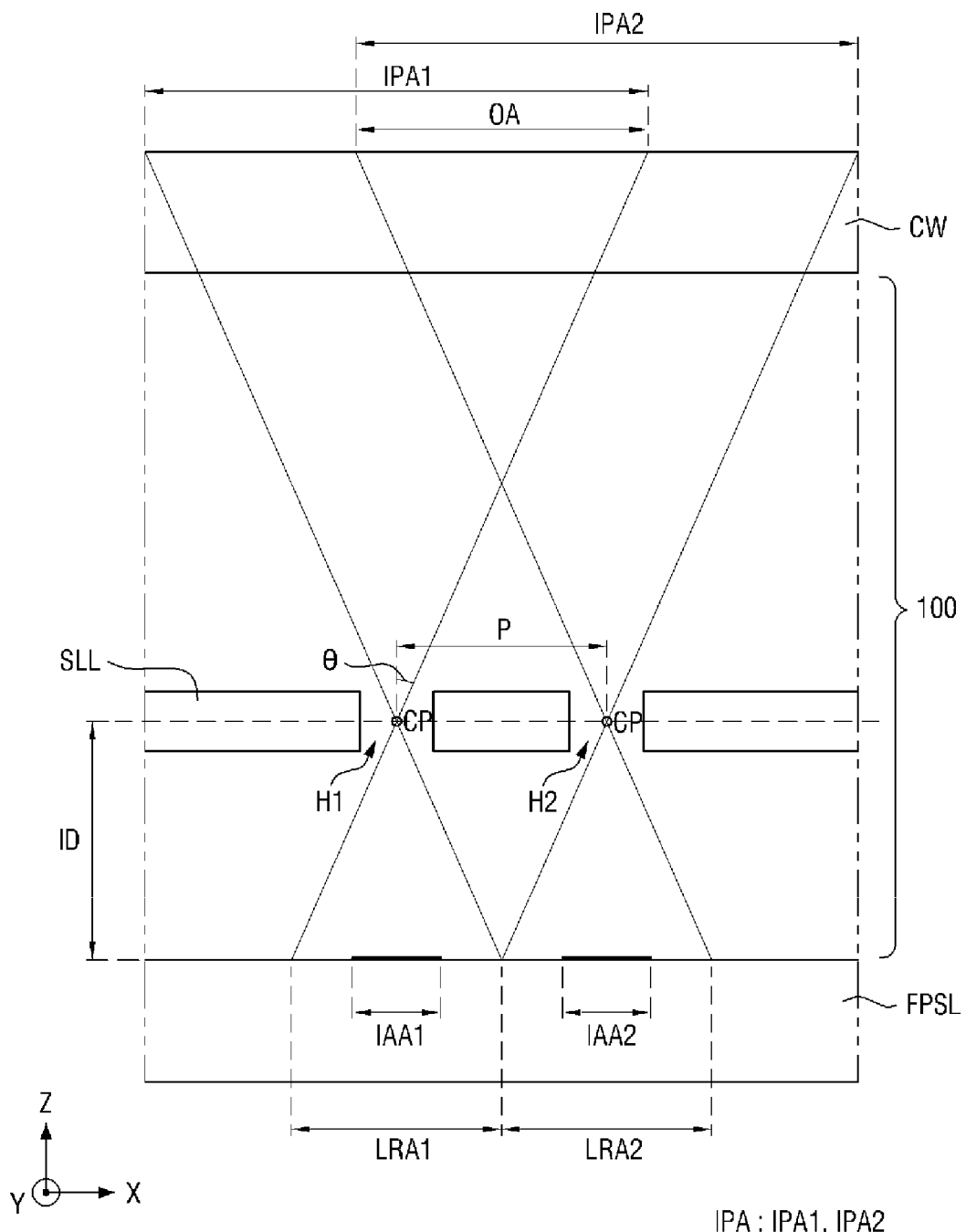
FIG. 4 schematically illustrates a travelling direction of reflected light according to an embodiment.

FIG. 4 schematically illustrates a travelling direction of reflected light according to an embodiment. Only the light blocking layer SLL of the display panel 100 is illustrated for ease of description, and light travelling from the cover window CW toward the fingerprint recognition sensor layer FPSL refers to light reflected by a user's finger.

Referring to FIG. 4, the cover window is on the display panel 100, and the fingerprint recognition sensor layer FPSL is under the display panel 100. The fingerprint recognition sensor layer FPSL may contact (e.g., physically or directly contact) a lower surface of the display panel 100, and the fingerprint recognition sensor layer FPSL and the display panel 100 may be closely attached to each other without an air gap between them. Because no (or substantially no) air gap is formed between the fingerprint recognition sensor layer FPSL and the display panel 100, the process can be simplified, the reliability of the display device 10 can be improved, and the thin display device 10 can be implemented. However, this does not exclude an unintended air gap created during a process of manufacturing.

The light blocking layer SLL may be in the display panel 100 and include a first hole H1 and a second hole H2. The first hole H1 and the second hole H2 may be spaced apart from each other, and light reflected by a user's fingerprint may reach the fingerprint recognition sensor layer FPSL through the first hole H1 and the second hole H2. For ease of description, light passing through the first hole H1 is defined as first light, and light passing through the second hole H2 is defined as second light.

In some embodiments, the cover window CW may include image sensing areas IPA. For example, the cover window CW may include a first image sensing area IPA1 and a second image sensing area IPA2. The first image sensing area IPA1 may be an area of the cover window CW where the first light recognizes fingerprint patterns, and the second image sensing area IPA2 may be an area of the cover window CW where the second light recognizes fingerprint patterns. In addition, in some embodiments, an overlap area OA in which the first image sensing area IPA1 and the second image sensing area IPA2 overlap may be formed. In this case, fingerprint patterns of a finger on the cover window CW can all be scanned.

A width of the first image sensing area IPA1 of the cover window CW in the first direction (X-axis direction) may depend on an incidence angle θ which is an angle at which the first light is incident on the first hole H1. The incidence angle θ may be defined based on the third direction (Z-axis direction) perpendicular (e.g., substantially perpendicular) to the first direction (X-axis direction). For example, when light is incident parallel (e.g., substantially parallel) to the third direction (Z-axis direction), the incidence angle θ may be 0 degrees. In addition, when light is incident at an acute angle to the third direction (Z-axis direction) in a clockwise direction in FIG. 4, the incidence angle θ may be defined as a positive angle. Further, when light is incident at an acute angle to the third direction (Z-axis direction) in a counter-clockwise direction in FIG. 4, the incidence angle θ may be defined as a negative angle.

In some embodiments, the incidence angle θ of the first light may be about −33 degrees to about 33 degrees. In addition, a width of the second image sensing area IPA2 of the cover window CW in the first direction (X-axis direction) may depend on an incidence angle which is an angle at which the second light is incident on the second hole H2. The incidence angle may be the same (e.g., substantially the same) as the incidence angle θ at which the first light is incident on the first hole H1.

In some embodiments, the fingerprint recognition sensor layer FPSL may include light receiving areas LRA. For example, the fingerprint recognition sensor layer FPSL may include a first light receiving area LRA1 and a second light receiving area LRA2. The first light receiving area LRA1 may be an area where the first light that has scanned fingerprint patterns is input to the fingerprint recognition sensor layer FPSL, and the second light receiving area LRA2 may be an area where the second light that has scanned fingerprint patterns is input to the fingerprint recognition sensor layer FPSL.

A width of the first light receiving area LRA1 in the first direction (X-axis direction) may be smaller than the width of the first image sensing area IPA1 in the first direction (X-axis direction), and a width of the second light receiving area LRA2 in the first direction (X-axis direction) may be smaller than the width of the second image sensing area IPA2 in the first direction (X-axis direction). This difference in width in the first direction (X-axis direction) between the first and second light receiving areas LRA1 and LRA2 and the first and second image sensing area IPA1 and IPA2 depends on the position of the light blocking layer SLL. For example, as the light blocking layer SLL is closer to the cover window CW, the widths of the first light receiving area LRA1 and the second light receiving area LRA2 in the first direction (X-axis direction) increase, but the widths of the first image sensing area IPA1 and the second image sensing area IPA2 in the first direction (X-axis direction) decrease. On the contrary, as the light blocking layer SLL is closer to the fingerprint recognition sensor layer FPSL, the widths of the first light receiving area LRA1 and the second light receiving area LRA2 in the first direction (X-axis direction) decrease, but the widths of the first image sensing area IPA1 and the second image sensing area IPA2 in the first direction (X-axis direction) increase.

In the current embodiment, the light blocking layer SLL is closer to the fingerprint recognition sensor layer FPSL than to the cover window CW. However, the position of the light blocking layer SLL can be variously changed.

In some embodiments, the first light receiving area LRA1 and the second light receiving area LRA2 may be in contact with each other (e.g., may physically or directly contact each other). For example, a side of the first light receiving area LRA1 and a side of the second light receiving area LRA2 may contact each other (e.g., may physically or directly contact each other). However, this does not exclude an unintended minute (e.g., small) gap or overlap created between the side of the first light receiving area LRA1 and the side of the second light receiving area LRA2 during a process.

In some embodiments, each of the first light receiving area LRA1 and the second light receiving area LRA2 may include an image collecting area IAA. For example, the first light receiving area LRA1 may include a first image collecting area IAA1, and the second light receiving area LRA2 may include a second image collecting area IAA2.

The first image collecting area IAA1 may be an area to which effective fingerprint pattern information is input among fingerprint patterns input to the first light receiving area LRA1, and the second image collecting area IAA2 may be an area to which effective fingerprint pattern information is input among fingerprint patterns input to the second light receiving area LRA2. Of the fingerprint patterns input to the first light receiving area LRA1 and the second light receiving area LRA2, only the fingerprint patterns input to each of the first image collecting area IAA1 and the second image collecting area IAA2 may be used to form a fingerprint image.

The first image collecting area IAA1 may be a core area remaining after outer edges of the first light receiving area LRA1 are removed. The second image collecting area IAA2 may be a core area remaining after outer edges of the second light receiving area LRA2 are removed.

The fingerprint recognition layer FPSL may stitch the fingerprint patterns input to the first image collecting area IAA1 and the second image collecting area IAA2 and perform image enhancement processing to obtain and recognize a final fingerprint image.

The first image collecting area IAA1 and the second image collecting area IAA2 may be spaced apart from each other in the first direction. For example, the first image collecting area IAA1 and the second image collecting area IAA2 may not overlap each other. Accordingly, overlap of effective fingerprint patterns input to the first image collecting area IAA1 and the second image collecting area IAA2 can be prevented reduced, which would otherwise cause an error in fingerprint recognition.

Because the first image collecting area IAA1 and the second image collecting area IAA2 are spaced apart from each other as described herein above while the first light receiving area LRA1 and the second light receiving area LRA2 are in contact with each other (e.g., may physically or directly contact each other), more accurate fingerprint recognition is possible.

The position of each of the first light receiving area LRA1 and the second light receiving area LRA2 and the position of each of the first image collecting area IAA1 and the second image collecting area IAA2 depend on a pitch P between the first hole H1 and the second hole H2. The pitch P between the first hole H1 and the second hole H2 is defined as a distance between a center point CP of the first hole H1 and a center point CP of the second hole H2 in the first direction (X-axis direction). In some embodiments, the pitch P between the first hole H1 and the second hole H2 may be proportional to a distance between the fingerprint recognition sensor layer FPSL and the light blocking layer SLL. For example, the pitch P between the first hole H1 and the second hole H2 may be defined as a distance or smallest gap between a center point of a hole, for example, the center point CP of the first hole H1 and an upper surface of the fingerprint recognition sensor layer FPSL. In some embodiments, the upper surface of the fingerprint recognition sensor layer FPSL may refer to an upper surface of a light receiving area of the fingerprint recognition sensor layer FPSL, an upper surface of a fingerprint recognition sensor FPS, or an upper surface of a light receiving area of the fingerprint recognition sensor FPS. For ease of description, a distance between a center point CP of a fingerprint recognition hole and the upper surface of the fingerprint recognition sensor layer FPSL will hereinafter be referred to as a hole-sensor distance ID.

In some embodiments, the pitch P between the first hole H1 and the second hole H2 may be about 1.3 to about 1.5 times the hole-sensor distance ID, for example, may be about 1.3 times the hole-sensor distance ID. For example, when the incidence angle θ of reflected light incident on each of the first hole H1 and the second hole H2 is about −33 degrees to about 33 degrees, the pitch P between the first hole H1 and the second hole H2 may be set to about 1.3 times the hole-sensor distance ID so that the first image collecting area IAA1 and the second image collecting area IAA2 can be spaced apart from each other while the first light receiving area LRA1 and the second light receiving area LRA2 are in contact with each other (e.g., may physically or directly contact each other). Accordingly, fingerprint recognition characteristics of the display device 10 can be effectively improved.

Figure 5:
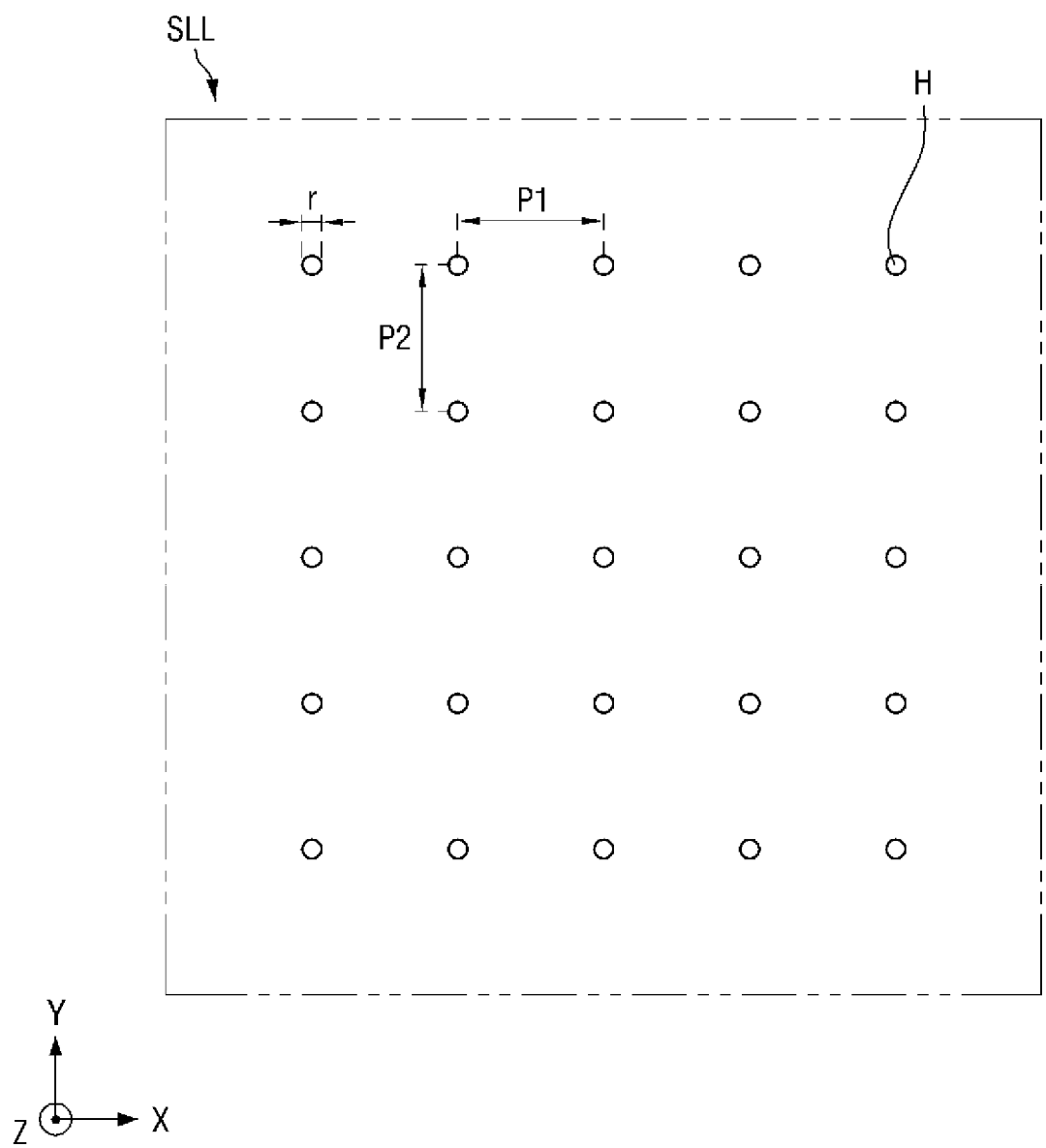
FIG. 5 is a plan view of a portion of a light blocking layer according to an embodiment.
Figure 6:
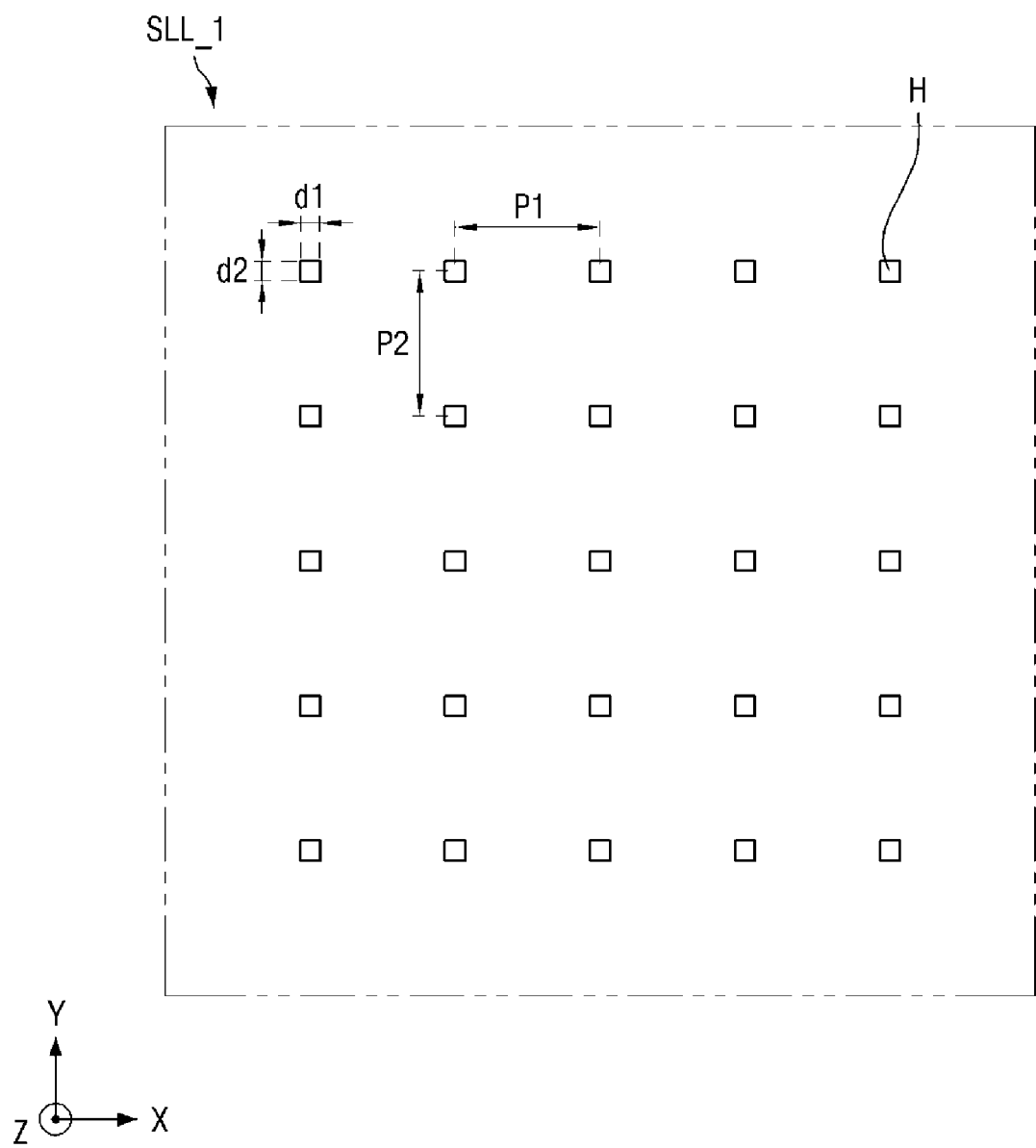
FIG. 6 is a plan view of a portion of a light blocking layer according to an embodiment.
Figure 7:
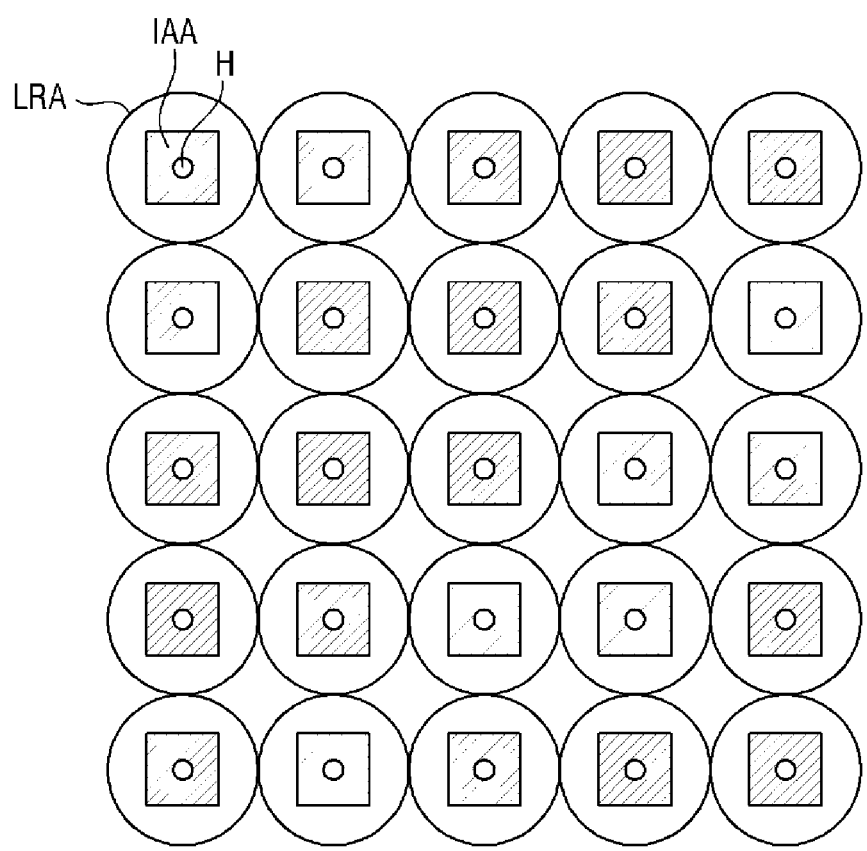
FIG. 7 is a plan view of holes, image collecting areas, and light receiving areas according to an embodiment.

FIG. 5 is a plan view of a portion of the light blocking layer SLL according to an embodiment. FIG. 6 is a plan view of a portion of a light blocking layer SLL_1 according to an embodiment. FIG. 7 is a plan view of holes H, image collecting areas IAA, and light receiving areas LRA according to an embodiment.

Referring to FIG. 5, in some embodiments, the light blocking layer SLL may include a plurality of holes H, and the holes H may be circular in a plan view.

Each of the holes H may have a diameter of, but not limited to, about 3 μm to about 20 μm. In some embodiments, the holes H may be provided with a first pitch P1 in the first direction (X-axis direction). For example, the first pitch P1 may be about 1.3 to about 1.5 times the hole-sensor distance ID, for example, may be about 1.3 times the hole-sensor distance ID. In some embodiments, the holes H may be provided with a second pitch P2 in the second direction (Y-axis direction). The second pitch P2 may be the same (e.g., substantially the same) as the first pitch P1, but embodiments are not limited to this case. In some embodiments, the first pitch P1 and the second pitch P2 may be different from each other. In addition, although the holes H are aligned parallel (e.g., substantially parallel) to each other in the first direction (X-axis direction) and the second direction (Y-axis direction) in FIG. 5, this is only an example, and embodiments are not limited to this example. The holes H may also be provided with the first pitch P1 and the second pitch P2 but may not be aligned in the first direction (X-axis direction) and the second direction (Y-axis direction).

Referring to FIG. 6, in some embodiments, the light blocking layer SLL_1 may include a plurality of square holes H. Each of the holes H may have a first length d1 in the first direction (X-axis direction) and a second length d2 in the second direction (Y-axis direction). The first length d1 may be, but is not limited to, about 3 μm to about 20 μm. In addition, the second length d2 of each of the holes H may be the same (e.g., substantially the same) as the first length d1. However, embodiments are not limited to this case, and the first length d1 and the second length d2 may also be different from each other. A first pitch P1 and a second pitch P2 of the holes H in the light blocking layer SLL_1 of FIG. 6 are the same (e.g., substantially the same) as those described in FIG. 5, and thus, a redundant description thereof is not repeated here. The shape of each of the holes H is not limited to the circular shape and the square shape illustrated in FIGS. 5 and 6. For example, each of the holes H may have various suitable shapes such as an elliptical shape and a polygonal shape. In addition, in some embodiments, the holes H in the light blocking layers SLL1 and SLL_1 may be composed of holes H having different shapes.

Referring to FIG. 7, in some embodiments, a plurality of holes H, a plurality of image collecting areas IAA, and a plurality of light receiving areas LRA may overlap in a thickness direction. For example, in a plan view, the image collecting areas IAA may be located within the light receiving areas LRA, and the holes H may be located within the image collecting areas IAA. In addition, one hole H, one image collecting area IAA, and one light receiving area LRA may form one unit.

The light receiving areas LRA may be in contact (e.g., physical or direct contact) with neighboring light receiving areas LRA. For example, the light receiving areas LRA may be in contact (e.g., physical or direct contact) with neighboring light receiving areas LRA in the first direction (X-axis direction) and the second direction (Y-axis direction). In some embodiments, one light receiving area LRA may be in contact (e.g., physical or direct contact) with four neighboring light receiving areas LRA but may not overlap the fourth neighboring light receiving areas LRA. However, this does not exclude an unintended minute (e.g., small) gap or overlap created during a process.

In some embodiments, the image collecting areas IAA may be spaced apart from each other. In addition, the holes H may be spaced apart from each other. A distance between the image collecting areas IAA may be greater than a distance between the holes H.

Figure 8:
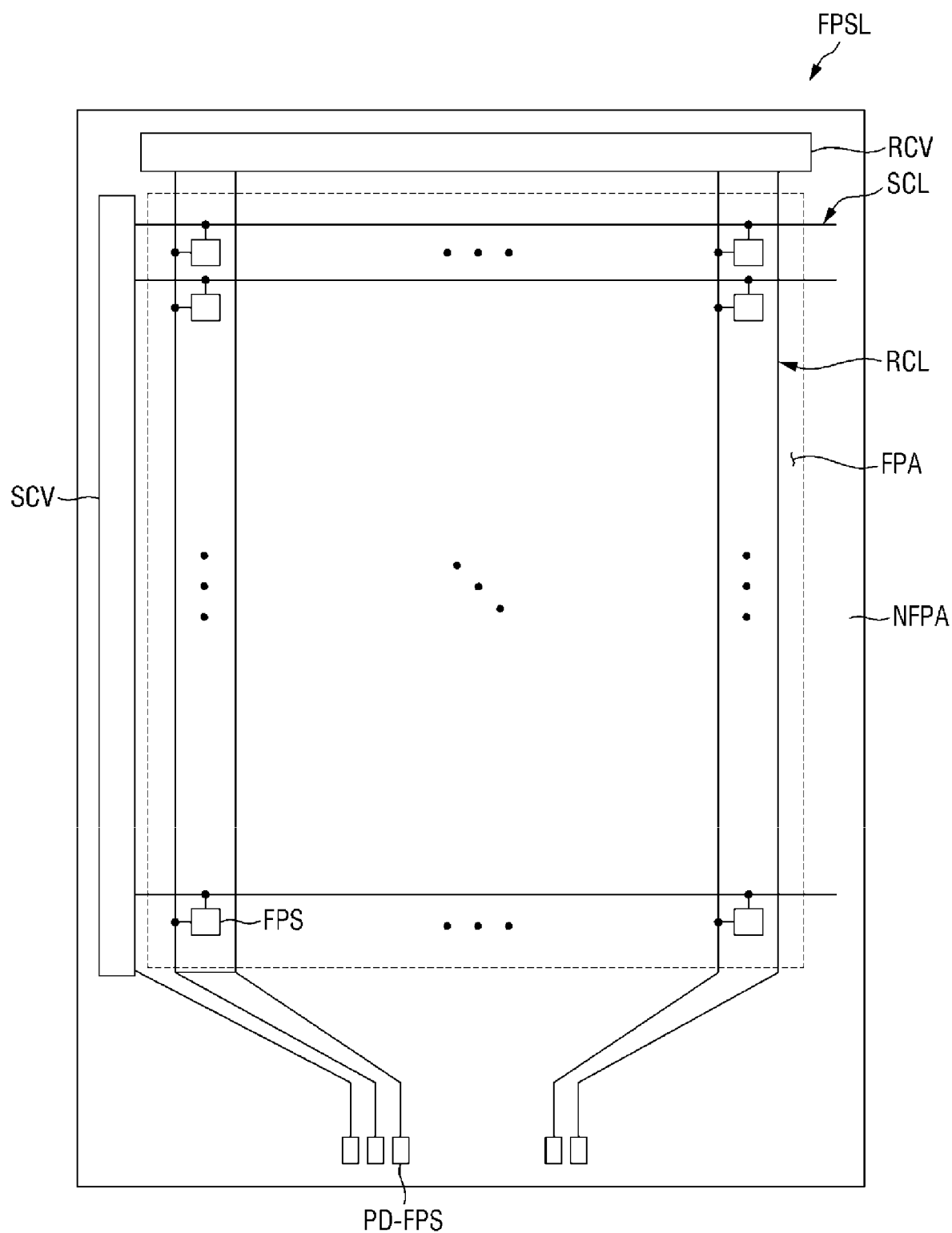
FIG. 8 is a schematic plan view of a fingerprint recognition sensor layer according to an embodiment.
Figure 9:
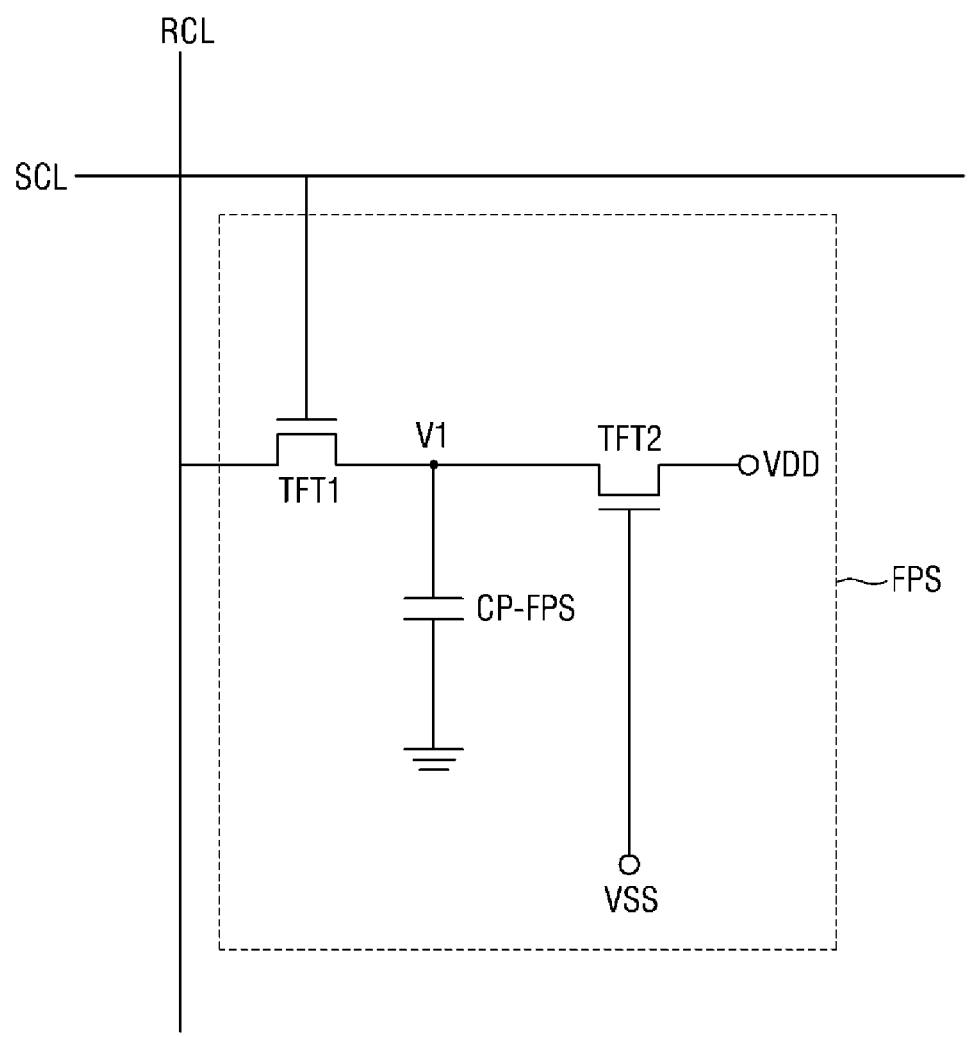
FIG. 9 is an equivalent circuit diagram of a fingerprint recognition sensor according to an embodiment.
Figure 10:
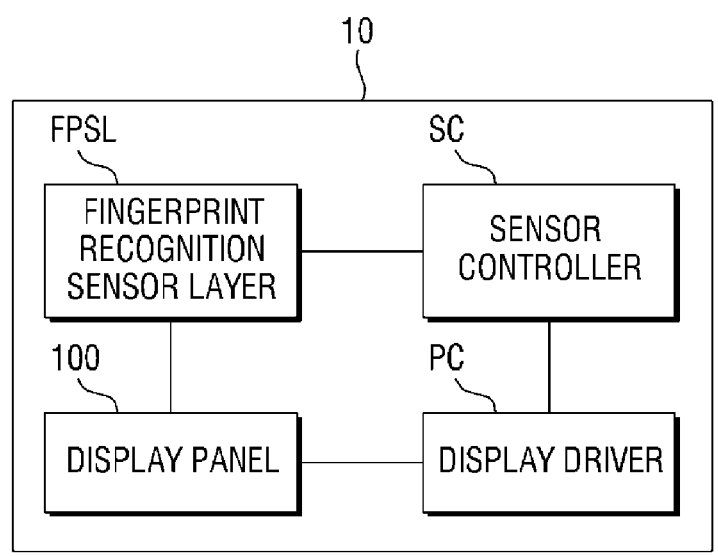
FIG. 10 is a block diagram of the display device according to the embodiment.

FIG. 8 is a schematic plan view of the fingerprint recognition sensor layer FPSL according to an embodiment. FIG. 9 is an equivalent circuit diagram of a fingerprint recognition sensor FPS according to an embodiment. FIG. 10 is a block diagram of the display device 10 according to the embodiment.

Referring to FIG. 8, the fingerprint recognition sensor layer FPSL may include a plurality of scan lines SCL, a plurality of readout lines RCL, and a plurality of fingerprint recognition sensors FPS. An area where the fingerprint recognition sensors FPS are located may be defined as the fingerprint recognition area FPA. In some embodiments, a distance between the fingerprint recognition sensors FPS may be about 5 μm to about 50 μm, and twenty to thirty fingerprint recognition sensors FPS may be located in one image collecting area IAA (see FIG. 7).

The scan lines SCL may respectively be coupled to corresponding fingerprint recognition sensors FPS among the fingerprint recognition sensors FPS, and the readout lines RCL may respectively be coupled to corresponding fingerprint recognition sensors FPS among the fingerprint recognition sensors FPS.

A non-fingerprint recognition area NFPA may be located outside the fingerprint recognition area FPA. A scan driver circuit SCV to which the scan lines SCL are coupled may be on a side of the non-fingerprint recognition area NFPA.

A readout circuit RCV to which the readout lines RCL are coupled may be on a side of the non-fingerprint recognition area NFPA. However, embodiments are not limited to this case, and signals transmitted from an external integrated circuit may also be transmitted to the readout lines RCL without the readout circuit RCV.

Each of the scan lines SCL and the readout lines RCL may include a fingerprint recognition sensor pad PD-FPS coupled to its end.

The fingerprint recognition sensor pads PD-FPS may be formed in the same process as transistors for driving the fingerprint recognition sensors FPS.

Scan signals may be sequentially supplied to the scan lines SCL, and the readout lines RCL may receive signals output from the fingerprint recognition sensors FPS and deliver the received signals to the fingerprint recognition sensors FPS. However, embodiments are not limited to this case, and the signals output from the fingerprint recognition sensors FPS may also be transmitted to another circuit (not illustrated) for processing the signals.

In FIG. 9, a fingerprint recognition sensor FPS coupled to any one scan line SCL and any one readout line RCL is illustrated as an example. The configuration of the fingerprint recognition sensor FPS is not limited to this example and can be changed.

The fingerprint recognition sensor FPS may include a first transistor TFT1, a second transistor TFT2, a sensing capacitor CP-FPS, and a voltage V1 between the first transistor TFT1 and the second transistor TFT2.

The first transistor TFT1 is a switching element and has a control electrode coupled to the scan line SCL, an output electrode coupled to the readout line RCL, and an input electrode coupled to the sensing capacitor CP-FPS. The second transistor TFT2 has an input electrode connected to an input voltage line VDD, an output electrode connected to the sensing capacitor CP-FPS, and a control electrode connected to a common voltage line VSS.

When light reflected from an external object is supplied to the second transistor TFT2, a semiconductor of a channel portion made of amorphous silicon or polycrystalline silicon forms an electric current, and the electric current is made to flow toward the sensing capacitor CP-FPS and the first transistor TFT1 by an input voltage input to the input voltage line VDD. In some embodiments, the second transistor TFT2 is a phototransistor. Phototransistors are a type (or kind) of optical sensor that converts light energy into electrical energy and uses a photovoltaic effect in which a flowing electric current varies according to the intensity of light. A device that amplifies a photocurrent by using a transistor is a phototransistor. When a selection signal is input to the scan line SCL, an electric current flows through the readout line RCL.

Referring to FIG. 10, the display device 10 according to the embodiment may further include a sensor controller SC and a display driver PC.

The sensor controller SC may control the operation of the fingerprint recognition sensor layer FPSL and recognize a user's fingerprint by sensing a change in the amount of light in the fingerprint recognition sensor layer FPSL.

The display driver PC may control an image display operation of the display panel 100 by supplying image driving signals to the display panel 100. The display driver PC may generate image driving signals by using image data and control signals received from an external source. For example, the display driver PC may receive the image data and the control signals from a host, and the control signals may include a vertical synchronization signal, a horizontal synchronization signal and a main clock signal. In addition, the image driving signals may include scan signals and data signals generated using the image data.

The sensor controller SC and the display driver PC may be integrated into a single element. For example, the sensor controller SC and the display driver PC may be implemented as a single integrated circuit.

The above structure is only an example used to describe the driving of the fingerprint recognition sensor FPS for recognizing fingerprints, and embodiments are not limited to this structure. Various suitable sensors capable of recognizing light are applicable as the fingerprint recognition sensor FPS of the present disclosure.

Figure 11:
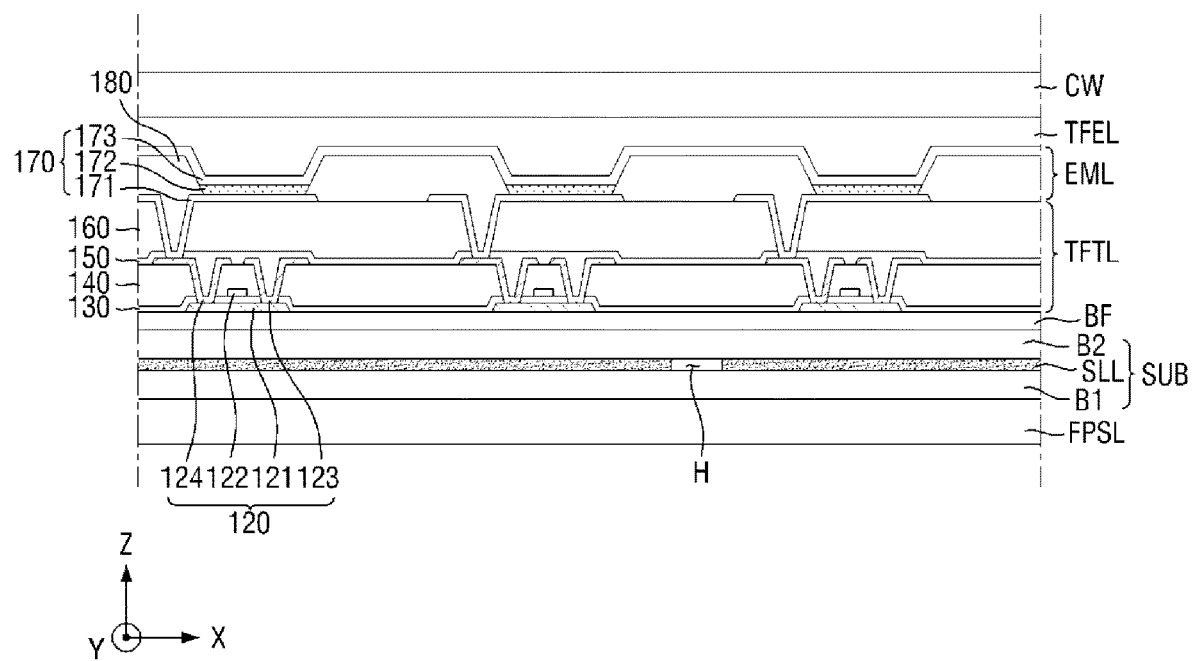
FIG. 11 is a cross-sectional view taken along I-I' of FIG. 2.
Figure 12:
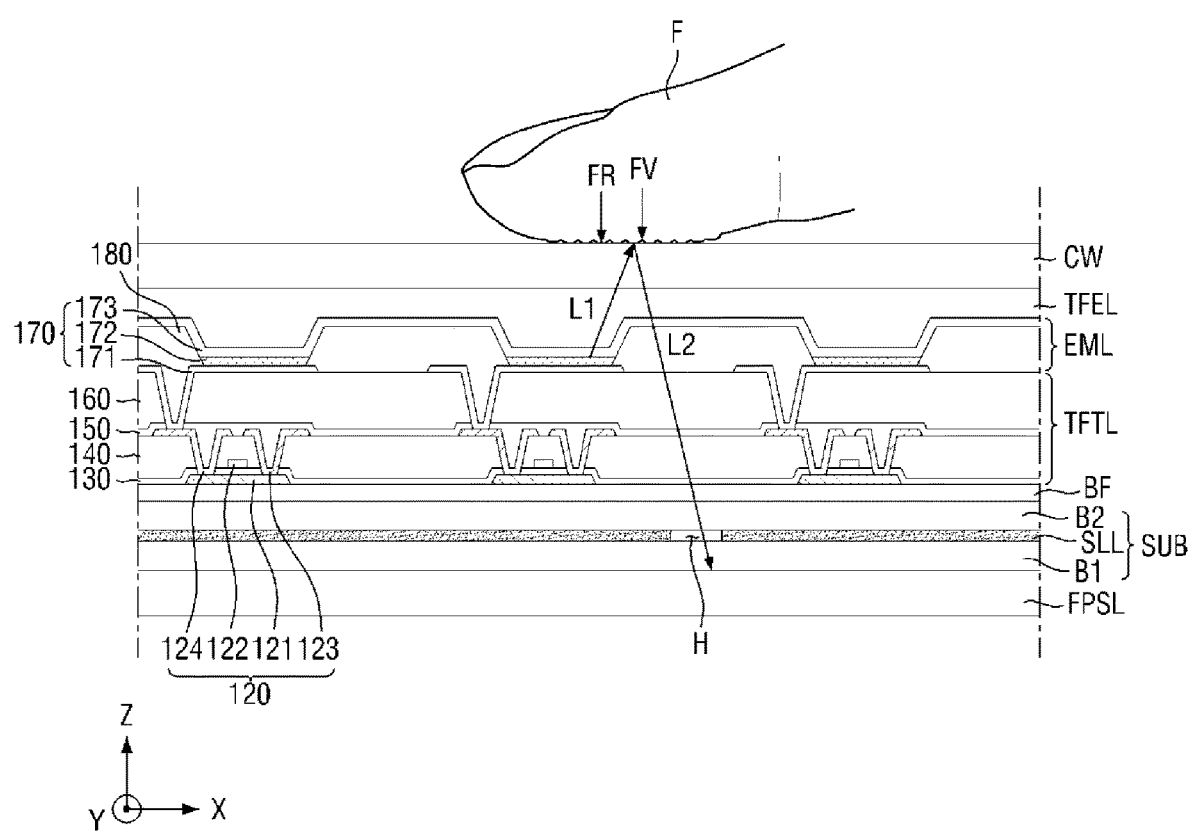
FIG. 12 schematically illustrates a fingerprint recognition process according to an embodiment.

FIG. 11 is a cross-sectional view taken along I-I' of FIG. 2. FIG. 12 schematically illustrates a fingerprint recognition process according to an embodiment.

Referring to FIG. 11, in some embodiments, the display device 10 (see FIG. 2) may include the fingerprint recognition sensor layer FPSL, the base substrate SUB, the thin-film transistor layer TFTL, the light emitting element layer EML, the thin-film encapsulation layer TFEL, and the cover window CW. Because the configuration of the fingerprint recognition sensor layer FPSL and the base substrate SUB has been described in more detail with reference to FIGS. 3 and 8 through 10, a redundant description thereof is not repeated here.

The thin-film transistor layer TFTL may be on the base substrate SUB. The thin-film transistor layer TFTL may include thin-film transistors 120, a gate insulating layer 130, an interlayer insulating layer 140, a protective layer 150, and a planarization layer 160.

A buffer layer BF may be on a surface of the base substrate SUB. The buffer layer BF may be formed on the surface of the base substrate SUB to protect the thin-film transistors 120 and organic light emitting layers 172 of the light emitting element layer EML from moisture introduced through the base substrate SUB which is vulnerable to moisture penetration. The buffer layer BF may be composed of a plurality of inorganic layers stacked alternately. For example, the buffer layer BF may be a multilayer in which one or more inorganic layers selected from a silicon nitride layer, a silicon oxynitride layer, a silicon oxide layer, a titanium oxide layer, and an aluminum oxide layer are alternately stacked.

The thin-film transistors 120 may be on the buffer layer BF. Each of the thin-film transistors 120 may include an active layer 121, a gate electrode 122, a source electrode 124, and a drain electrode 123. In FIG. 11, each of the thin-film transistors 120 is formed as a top-gate type (or kind) in which the gate electrode 122 is located above the active layer 121. However, embodiments are not limited to this case. For example, each of the thin-film transistors 120 may also be formed as a bottom-gate type (or kind) in which the gate electrode 122 is located below the active layer 121 or a double-gate type (or kind) in which the gate electrode 122 is located both above and below the active layer 121.

In some embodiments, the thin-film transistors 120 may not overlap a hole H in the light blocking layer SLL in the third direction (Z-axis direction). Accordingly, reflection by the thin-film transistors 120 of light travelling toward the hole H after being reflected by a user's finger can be prevented or reduced. In addition, the thin-film transistors 120 may be spaced apart from the hole H in the light blocking layer SLL by a set (e.g., predetermined) distance in the first direction (X-axis direction) in consideration of an incidence angle of the light travelling toward the hole H after being reflected by the user's finger.

The active layers 121 may be on the buffer layer BF. The active layers 121 may include polycrystalline silicon, monocrystalline silicon, low-temperature polycrystalline silicon, amorphous silicon, or an oxide semiconductor. Examples of the oxide semiconductor may include binary compounds (ABx), ternary compounds (ABxCy) and quaternary compounds (ABxCyDz) containing indium, zinc, gallium, tin, titanium, aluminum, hafnium (Hf), zirconium (Zr), magnesium (Mg), etc. For example, the active layers 121 may include ITZO (an oxide including indium, tin, and titanium) or IGZO (an oxide including indium, gallium, and tin). A light blocking layer may be formed between the buffer layer BF and the active layers 121 to block external light from entering the active layers 121.

The gate insulating layer 130 may be on the active layers 121. The gate insulating layer 130 may be made of an inorganic layer such as a silicon nitride layer, a silicon oxynitride layer, a silicon oxide layer, a titanium oxide layer, or an aluminum oxide layer.

The gate electrodes 122 and gate lines may be on the gate insulating layer 130. Each of the gate electrodes 122 and the gate lines may be a single layer or a multilayer made of any one or more selected from molybdenum (Mo), aluminum (Al), chromium (Cr), gold (Au), titanium (Ti), nickel (Ni), neodymium (Nd), copper (Cu), and alloys of the same.

The interlayer insulating layer 140 may be on the gate electrodes 122 and the gate lines. The interlayer insulating layer 140 may be made of an inorganic layer such as a silicon nitride layer, a silicon oxynitride layer, a silicon oxide layer, a titanium oxide layer, or an aluminum oxide layer.

The source electrodes 124 and the drain electrodes 123 may be on the interlayer insulating layer 140. Each of the source electrodes 124 and the drain electrodes 123 may be coupled to an active layer 121 through a contact hole penetrating the gate insulating layer 130 and the interlayer insulating layer 140. Each of the source electrodes 124 and the drain electrodes 123 may be a single layer or a multilayer made of any one or more selected from molybdenum (Mo), aluminum (Al), chromium (Cr), gold (Au), titanium (Ti), nickel (Ni), neodymium (Nd), copper (Cu), and alloys of the same.

The protective layer 150 for insulating the thin-film transistors 120 may be on the source electrodes 124 and the drain electrodes 123. The protective layer 150 may be made of an inorganic layer such as a silicon nitride layer, a silicon oxynitride layer, a silicon oxide layer, a titanium oxide layer, or an aluminum oxide layer.

The planarization layer 160 may be on the protective layer 150 to planarize steps formed by the thin-film transistors 120. The planarization layer 160 may be made of an organic layer such as acryl resin, epoxy resin, phenolic resin, polyamide resin, or polyimide resin.

The light emitting element layer EML is on the thin-film transistor layer TFTL. The light emitting element layer EML includes light emitting elements 170 and a pixel defining layer 180.

The light emitting elements 170 and the pixel defining layer 180 are on the planarization layer 160. Each of the light emitting elements 170 may include a first electrode 171, the organic light emitting layer 172, and a second electrode 173.

The first electrodes 171 may be on the planarization layer 160. The first electrodes 171 are coupled to the source electrodes 124 of the thin-film transistors 120 through contact holes penetrating the protective layer 150 and the planarization layer 160. However, embodiments are not limited to this case. The first electrodes 171 may also be coupled to the drain electrodes 123 of the thin-film transistors 120 through contact holes penetrating the protective layer 150 and the planarization layer 160.

In a top emission structure in which light is emitted from the organic light emitting layers 172 toward the second electrode 173, the first electrodes 171 may be made of a metal material having high reflectivity, such as a stacked structure (Ti/Al/Ti) of aluminum and titanium, a stacked structure (ITO/Al/ITO) of aluminum and indium tin oxide, an APC alloy, or a stacked structure (ITO/APC/ITO) of an APC alloy and indium tin oxide. The APC alloy is an alloy of silver (Ag), palladium (Pd), and copper (Cu). However, embodiments are not limited to this structure. In a bottom emission structure in which light is emitted from the organic light emitting layers 172 toward the first electrodes 171, the first electrodes 171 may be made of a transparent conductive material (TCO) capable of transmitting light, such as ITO or IZO, or a semi-transmissive conductive material such as magnesium (Mg), silver (Ag) or an alloy of Mg and Ag. In this case, when the first electrodes 171 are made of a semi-transmissive conductive material, the light output efficiency may be increased by a microcavity. The top emission structure in which light is emitted from the organic light emitting layers 172 toward the second electrode 173 will be described below as an example.

The pixel defining layer 180 may be on the planarization layer 160 to separate the first electrodes 171 so as to serve as a pixel defining layer for defining the subpixels SP. The pixel defining layer 180 may cover edges of the first electrodes 171. The pixel defining layer 180 may be made of an organic layer such as acryl resin, epoxy resin, phenolic resin, polyamide resin, or polyimide resin.

Each of the subpixels SP is an area where the first electrode 171, the organic light emitting layer 172, and the second electrode 173 are sequentially stacked so that holes from the first electrode 171 and electrons from the second electrode 173 combine together in the organic light emitting layer 172 to emit light.

The organic light emitting layers 172 are formed on the first electrodes 171 and the pixel defining layer 180. Each of the organic light emitting layers 172 may include an organic material and emit light of a set (e.g., predetermined) color. For example, each of the organic light emitting layers 172 may include a hole transporting layer, an organic material layer, and an electron transporting layer. In this case, the organic light emitting layers 172 of red subpixels R may emit red light, the organic light emitting layers 172 of green subpixels G may emit green light, and the organic light emitting layers 172 of blue subpixels B may emit blue light. In some embodiments, the organic light emitting layers 172 of the subpixels SP may emit white light. In this case, the red subpixels R may further include red color filter layers, the green subpixels G may further include green color filter layers, and the blue subpixels B may further include blue color filter layers.

The second electrode 173 is on the organic light emitting layers 172. The second electrode 173 may be a common layer common to all of the subpixels SP. A capping layer may be on the second electrode 173.

In the top emission structure, the second electrode 173 may be made of a transparent conductive material (TCO) capable of transmitting light, such as ITO or IZO, or a semi-transmissive conductive material such as magnesium (Mg), silver (Ag) or an alloy of Mg and Ag. When the second electrode 173 is made of a semi-transmissive conductive material, the light output efficiency may be increased by a microcavity.

The thin-film encapsulation layer TFEL is on the light emitting element layer EML. The thin-film encapsulation layer TFEL may include at least one inorganic layer to prevent or reduce the penetration of oxygen and/or moisture into the organic light emitting layers 172 and the second electrode 173. In addition, the thin-film encapsulation layer TFEL may include at least one organic layer to protect the light emitting element layer EML from foreign substances such as dust. For example, the thin-film encapsulation layer TFEL may include a first inorganic layer on the second electrode 173, an organic layer on the first inorganic layer, and a second inorganic layer on the organic layer. The first inorganic layer and the second inorganic layer may be made of, but not limited to, a silicon nitride layer, a silicon oxynitride layer, a silicon oxide layer, a titanium oxide layer, or an aluminum oxide layer. The organic layer may be made of, but not limited to, acryl resin, epoxy resin, phenolic resin, polyamide resin, or polyimide resin.

The cover window CW may be on the thin-film encapsulation layer TFEL. The cover window CW on the thin-film encapsulation layer TFEL may protect the elements of the display device 10 while transmitting light output from the light emitting element layer EML.

The cover window CW may include transparent glass or a transparent material such as polyethylene terephthalate, polyvinyl resin, polyester, or the like. However, embodiments are not limited to this case. The type (or kind) of the cover window CW is not limited as long as it has suitable or sufficient transmittance to transmit light output from the light emitting element layer EML. In some embodiments, a polarizer may be between the cover window CW and the thin-film encapsulation layer TFEL.

Referring to FIG. 12, when a user's finger F touches the cover window CW, light L1 output from the organic light emitting layer 172 is reflected by ridges FR or valleys FV of the user's finger F, and the reflected light L2 is received by the fingerprint recognition sensor layer FPSL. Thus, the user's fingerprint patterns may be transmitted to the fingerprint recognition sensor layer FPSL.

Figure 13:
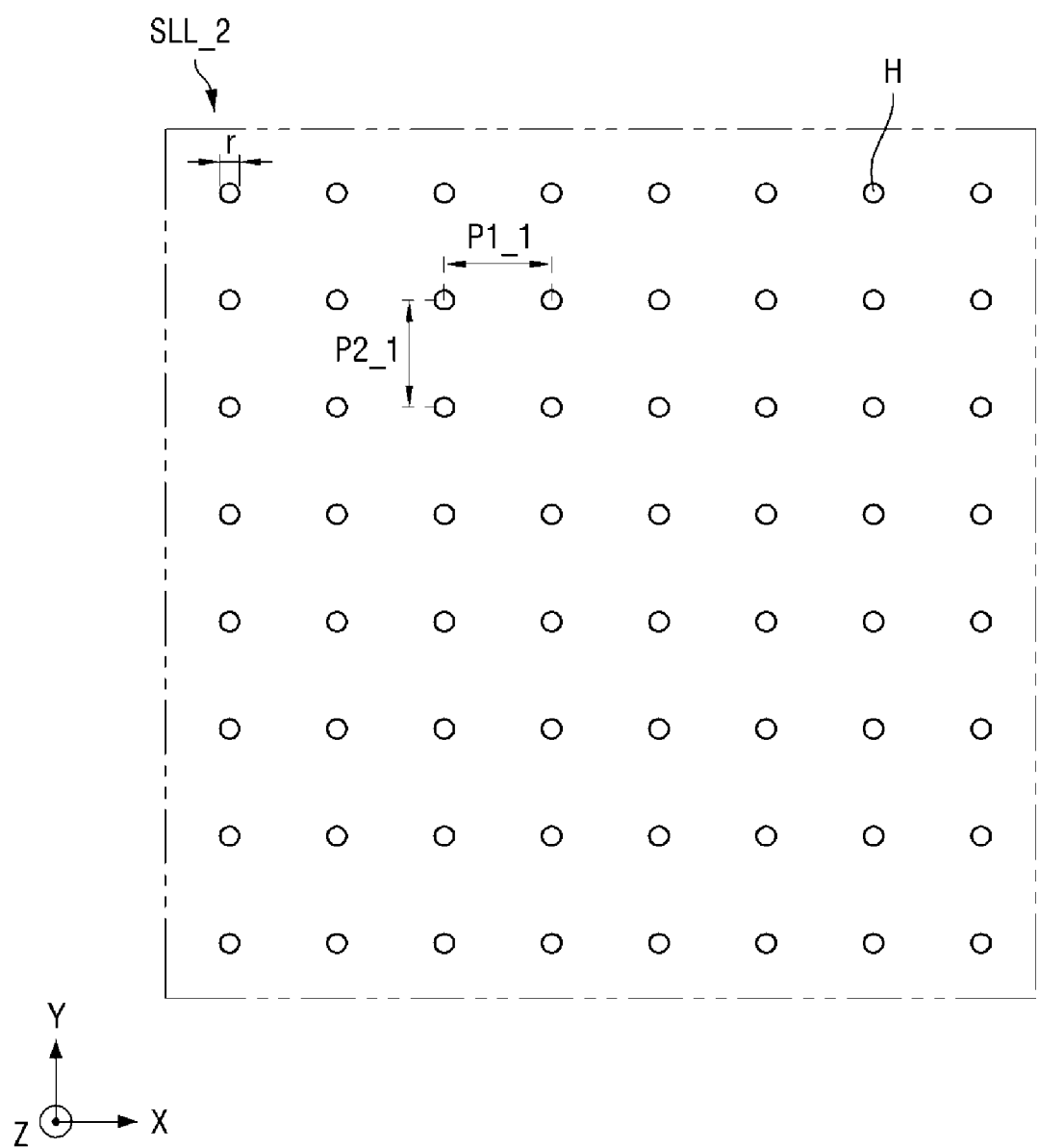
FIG. 13 is a plan view of a portion of a light blocking layer according to an embodiment.
Figure 14:
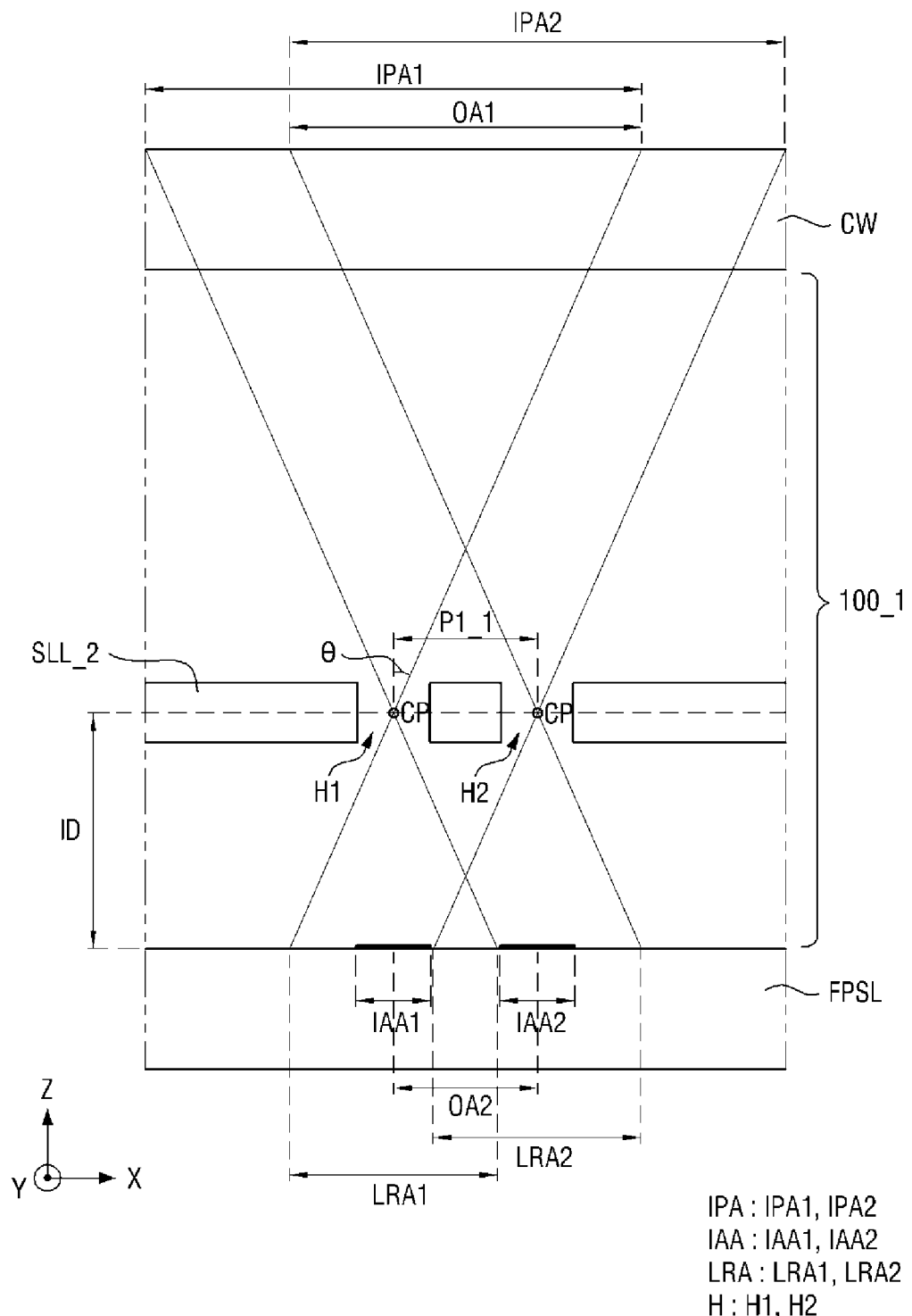
FIG. 14 schematically illustrates a travelling direction of reflected light according to an embodiment.
Figure 15:
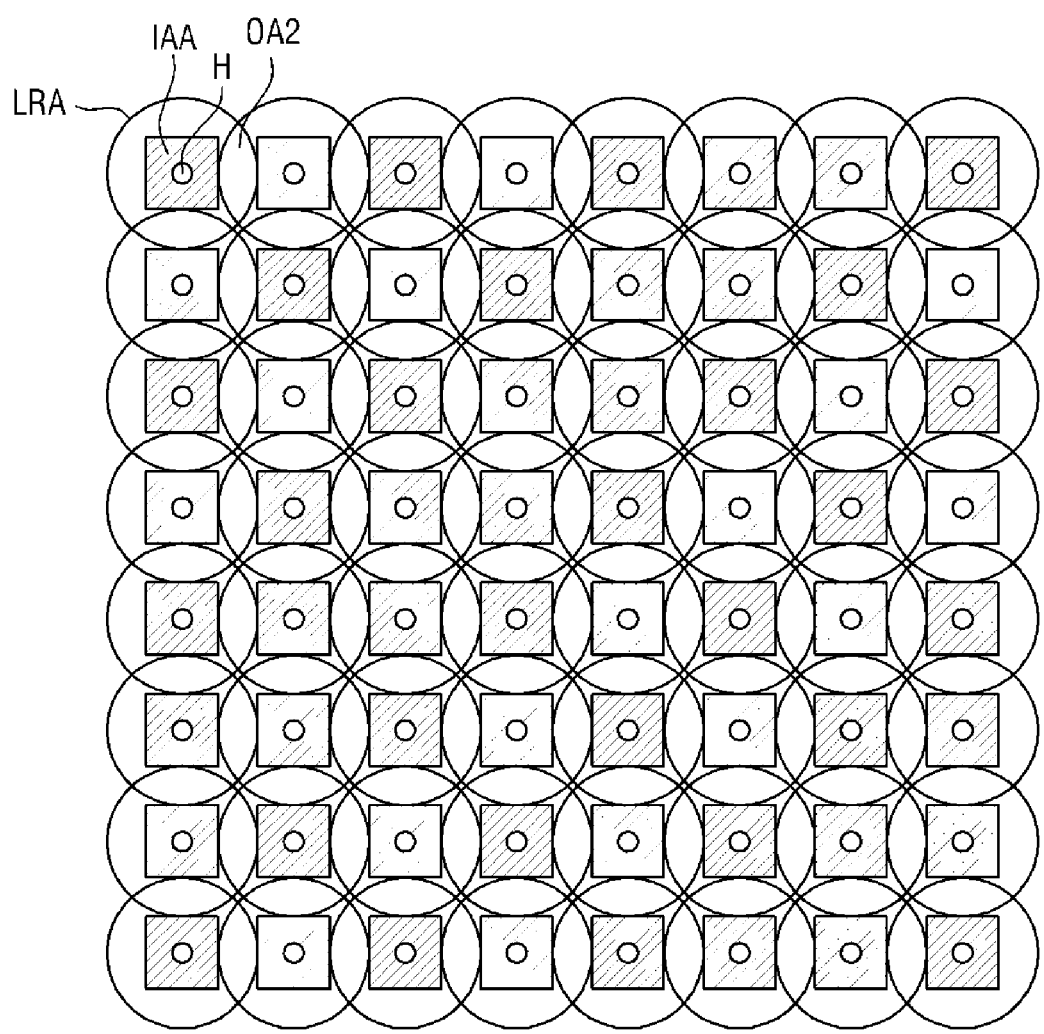
FIG. 15 is a plan view of holes, image collecting areas, and light receiving areas according to an embodiment.

FIG. 13 is a plan view of a portion of a light blocking layer SLL_2 according to an embodiment. FIG. 14 schematically illustrates a travelling direction of reflected light according to an embodiment. FIG. 15 is a plan view of holes H, image collecting areas IAA, and light receiving areas LRA according to an embodiment. The embodiment of FIGS. 13 through 15 is different from the embodiment of FIGS. 4, 5 and 7 in pitches of the holes H included in the light blocking layer SLL_2. A redundant description of elements and features identical to those of the embodiment of FIGS. 4, 5 and 7 will not be repeated here, and differences will be mainly described below.

Referring to FIG. 13, in some embodiments, the light blocking layer SLL_2 may include a plurality of holes H. Each of the holes H may have a diameter of, but not limited to, about 3 μm to about 20 μm.

In some embodiments, the holes H may be provided with a first pitch P1_1 in the first direction (X-axis direction). For example, the first pitch P1_1 may be about 0.5 to about 1.2 times a hole-sensor distance ID. In some embodiments, the holes H may be provided with a second pitch P2_1 in the second direction (Y-axis direction). The second pitch P2_1 may be the same (e.g., substantially the same) as the first pitch P1_1, but embodiments are not limited to this case. In some embodiments, the first pitch P1_1 and the second pitch P2_1 may be different from each other. In addition, although the holes H are aligned parallel (e.g., substantially parallel) to each other in the first direction (X-axis direction) and the second direction (Y-axis direction) in FIG. 13, this is only an example, and embodiments are not limited to this example. The holes H may also be provided with the first pitch P1_1 and the second pitch P2_1 but may not be aligned in the first direction (X-axis direction) and the second direction (Y-axis direction).

Referring to FIG. 14, a cover window CW is on a display panel 100_1, and a fingerprint recognition sensor layer FPSL is under the display panel 100_1.

In some embodiments, the light blocking layer SLL_2 may be in the display panel 100_1 and may include a first hole H1 and a second hole H2. The first hole H1 and the second hole H2 may be spaced apart from each other. The first pitch P1_1 defined as a distance between a center point CP of the first hole H1 and a center point CP of the second hole H2 may be about 0.5 to about 1.2 times the hole-sensor distance ID. Because a width of the first pitch P1_1 is reduced as compared with the embodiment of FIGS. 4, 5 and 7, the amount of light input to the fingerprint recognition sensor layer FPSL is increased, thereby improving fingerprint recognition characteristics.

In some embodiments, the cover window CW may include a first image sensing area IPA1 and a second image sensing area IPA2, and a first overlap area OA1 in which the first image sensing area IPA1 and the second image sensing area IPA2 overlap may be formed.

In some embodiments, the fingerprint recognition sensor layer FPSL may include light receiving areas LRA. For example, the fingerprint recognition sensor layer FPSL may include a first light receiving area LRA1 and a second light receiving area LRA2. The first light receiving area LRA1 and the second light receiving area LRA2 may overlap each other. For example, a side of the first light receiving area LRA1 and a side of the second light receiving area LRA2 may overlap each other to form a second overlap area OA2. A width of the second overlap area OA2 in the first direction (X-axis direction) may be greater than a width of the first overlap area OA1 in the first direction (X-axis direction).

In some embodiments, each of the first light receiving area LRA1 and the second light receiving area LRA2 may include an image collecting area IAA. For example, the first light receiving area LRA1 may include a first image collecting area IAA1, and the second light receiving area LRA2 may include a second image collecting area IAA2.

The first image collecting area IAA1 and the second image collecting area IAA2 may be spaced apart from each other in the first direction. In some embodiments, the first light receiving area LRA1 and the second light receiving area LRA2 may overlap each other, but the first image collecting area IAA1 and the second image collecting area IAA2 may not overlap each other. Because the amount of light is increased due to the overlap of the first image collecting area IAA1 and the second image collecting area IAA2, more precise fingerprint recognition is possible. In addition, overlap of effective fingerprint patterns of the first image collecting area IAA1 and the second image collecting area IAA2 can be prevented or reduced, which would otherwise cause an error in fingerprint recognition.

In some embodiments, the first image collecting area IAA1 and the second image collecting area IAA2 may not overlap the second overlap area OA2. For example, the first image collecting area IAA1 may not overlap the second light receiving area LRA2, and the second image collecting area IAA2 may not overlap the first light receiving area LRA1. In some embodiments, the first image collecting area IAA1 and the second image collecting area IAA2 may partially overlap the second overlap area OA2. Even in this case, the first image collecting area IAA1 and the second image collecting area IAA2 may not overlap each other.

Referring to FIG. 15, in some embodiments, a plurality of holes H, a plurality of image collecting areas IAA, and a plurality of light receiving areas LRA may overlap in the thickness direction. For example, in a plan view, the image collecting areas IAA may be located within the light receiving areas LRA, and the holes H may be located within the image collecting areas IAA. In addition, one hole H, one image collecting area IAA, and one light receiving area LRA may form one unit.

The light receiving areas LRA may overlap neighboring light receiving areas LRA. For example, the light receiving areas LRA may overlap neighboring light receiving areas LRA in the first direction (X-axis direction) and the second direction (Y-axis direction). In some embodiments, one light receiving area LRA may overlap four neighboring light receiving areas LRA, and four second overlap areas OA2 may be formed. Accordingly, one image collecting area IAA may be surrounded by four second overlap areas OA2.

In some embodiments, the image collecting areas IAA may be spaced apart from each other with the second overlap area OA2 interposed between them.

Figure 16:
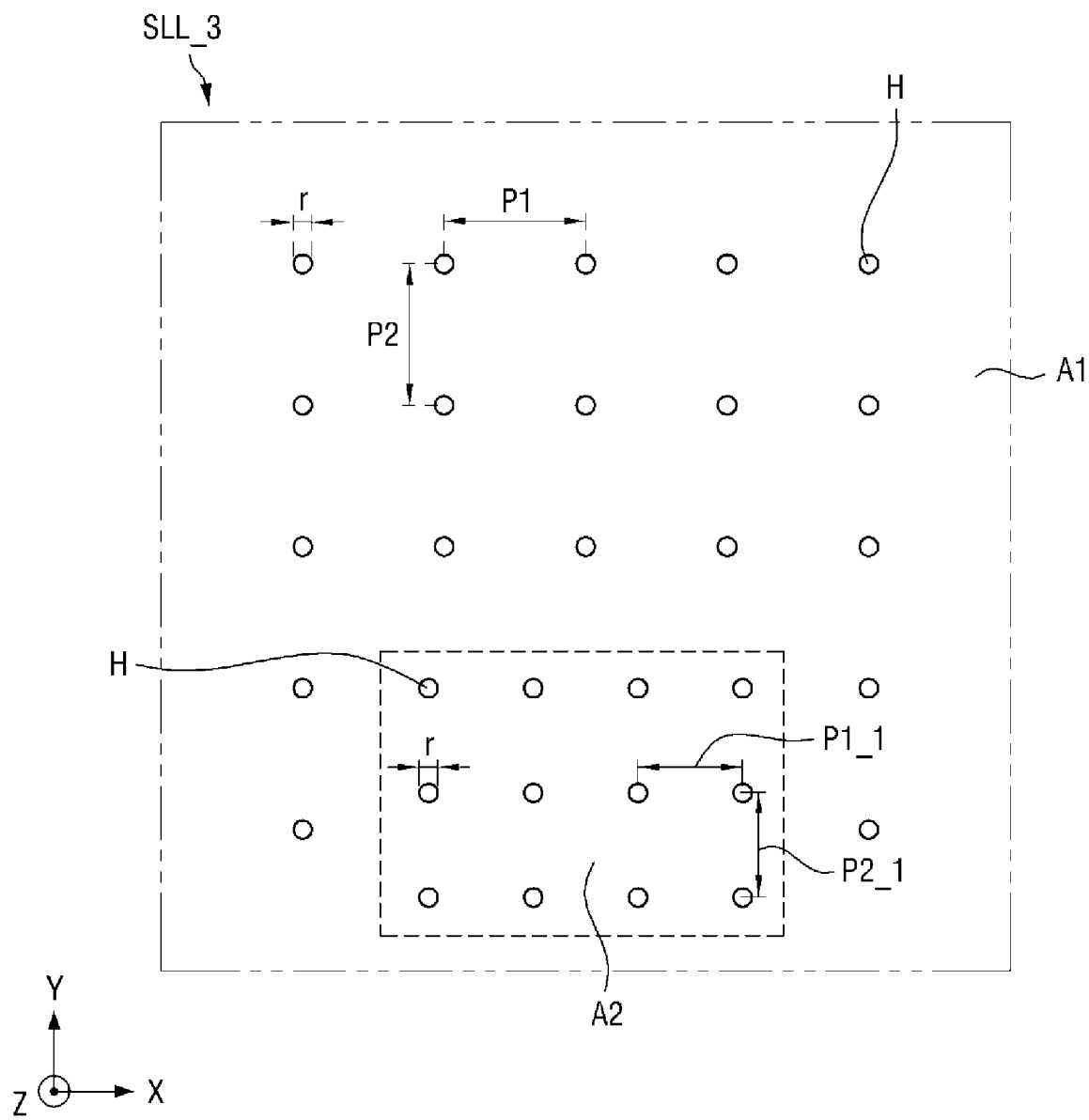
FIG. 16 is a plan view of a portion of a light blocking layer according to an embodiment.
Figure 17:
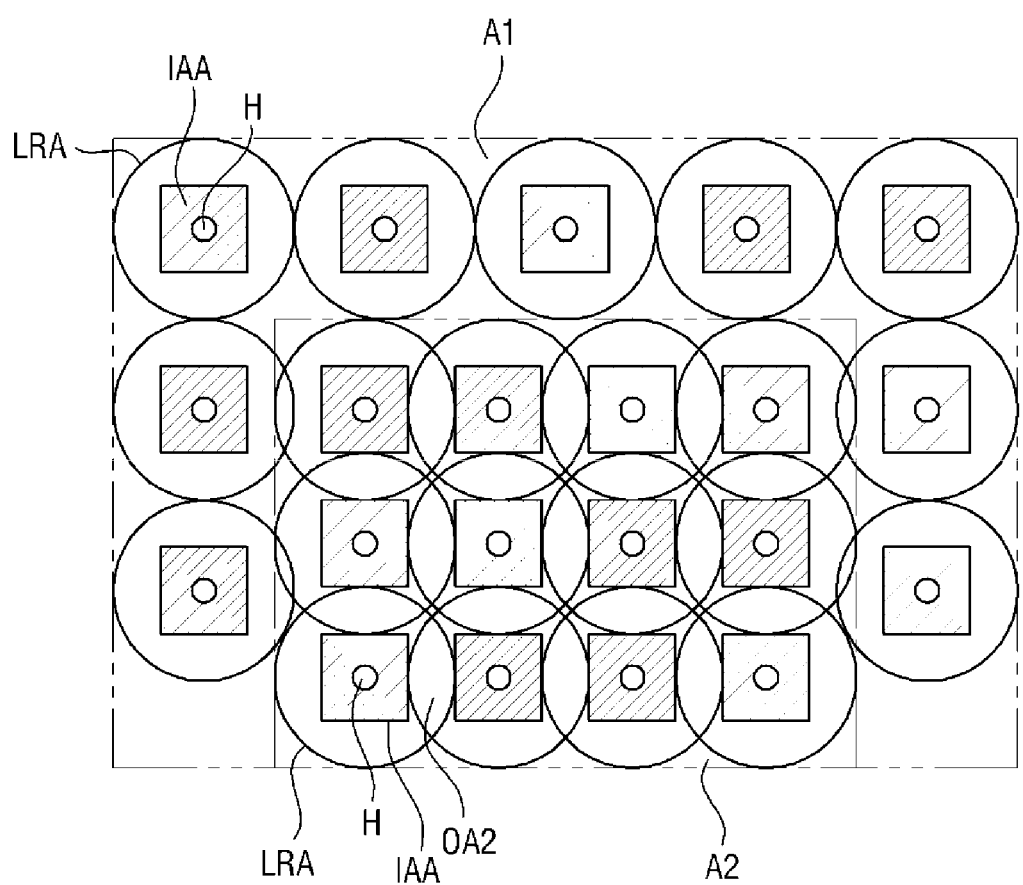
FIG. 17 is a plan view of holes, image collecting areas, and light receiving areas according to an embodiment; and Each of FIGS. 18 through 23 is a cross-sectional view of a modified example of the display device illustrated in FIG. 3.

FIG. 16 is a plan view of a portion of a light blocking layer SLL_3 according to an embodiment. FIG. 17 is a plan view of holes H, image collecting areas IAA, and light receiving areas LRA according to an embodiment. The embodiment of FIGS. 16 and 17 is different from the embodiment of FIGS. 4, 5 and 7 in that pitches of holes H in a first area A1 of the light blocking layer SLL_3 are different from those of holes H in a second area A2. A redundant description of elements and features identical to those of the embodiment of FIGS. 4, 5 and 7 will not be repeated here, and differences will be mainly described below.

Referring to FIGS. 16 and 17, the light blocking layer SLL_3 may include the first area A1 and the second area A2. Each of the first area A1 and the second area A2 may include holes H. The holes H in each of the first area A1 and the second area A2 may have a diameter r of about 3 μm to about 20 μm. Although the holes H in each of the first area A1 and the second area A2 have the same (e.g., substantially the same) area in FIGS. 16 and 17, embodiments are not limited to this case. The holes H in each of the first area A1 and the second area A2 may also have different areas within the range of about 3 μm to about 20 μm.

In some embodiments, the holes H located in the first area A1 may be provided with a first pitch P1 in the first direction (X-axis direction). For example, the first pitch P1 may be about 1.3 times a hole-sensor distance ID. In addition, the holes H located in the first area A1 may be provided with a second pitch P2 in the second direction (Y-axis direction), and the second pitch P2 may be the same (e.g., substantially the same) as the first pitch P1.

In some embodiments, the holes H located in the second area A2 may be provided with a first pitch P1_1 in the first direction (X-axis direction). For example, the first pitch P1_1 may be about 0.5 to about 1.2 times the hole-sensor distance ID. In addition, the holes H located in the second area A2 may be provided with a second pitch P2_1 in the second direction (Y-axis direction). The second pitch P2_1 may be the same (e.g., substantially the same) as the first pitch P1_1.

A plurality of holes H, a plurality of image collecting areas IAA, and a plurality of light receiving areas LRA located in the first area A1 may overlap in the thickness direction. For example, in a plan view, the image collecting areas IAA may be located within the light receiving areas LRA, and the holes H may be located within the image collecting areas IAA. In addition, one hole H, one image collecting area IAA, and one light receiving area LRA may form one unit.

The light receiving areas LRA located in the first area A1 may be in contact (e.g., physical or direct contact) with neighboring light receiving areas LRA. For example, the light receiving areas LRA may be in contact (e.g., may physical or direct contact) with neighboring light receiving areas LRA in the first direction (X-axis direction) and the second direction (Y-axis direction). In some embodiments, one light receiving area LRA located in the first area A1 may be in contact (e.g., direct or physical contact) with four neighboring light receiving areas LRA but may not overlap the fourth neighboring light receiving areas LRA. However, this does not exclude an unintended minute (e.g., small) gap or overlap created during a process.

In some embodiments, the image collecting areas IAA located in the first area A1 may be spaced apart from each other. In addition, the holes H located in the first area A1 may be spaced apart from each other. A distance between the image collecting areas IAA may be greater than a distance between the holes H.

In some embodiments, a plurality of light receiving areas LRA located in the second area A2 may overlap neighboring light receiving areas LRA. For example, the light receiving areas LRA may overlap neighboring light receiving areas LRA in the first direction (X-axis direction) and the second direction (Y-axis direction). In some embodiments, one light receiving area LRA located in the second area A2 may overlap four neighboring light receiving areas LRA, and four second overlap areas OA2 may be formed. Accordingly, one image collecting area IAA may be surrounded by four second overlap areas OA2.

In some embodiments, a plurality of image collecting areas IAA located in the second area A2 may be spaced apart from each other by the second overlap area OA interposed between them.

In some embodiments, some of the light receiving areas LRA of the first area A1 and some of the light receiving areas LRA of the second area A2 may overlap in an area where the first area A1 and the second area A2 contact (e.g., directly or physically contact) each other. However, the light receiving areas LRA of the first area A1 and the light receiving areas LRA of the second area A2 may also not overlap in the area where the first area A1 and the second area A2 contact (e.g., directly or physically contact) each other. By dividing the light blocking layer SLL_3 into the first area A1 and the second area A2 and setting the pitches P1 and P2 of the holes H in the first area A1 differently from the pitches P1_1 and P2_1 of the holes H in the second area A2 as described herein above, it is possible to adjust fingerprint recognition characteristics of a desired area.

Each of FIGS. 18 through 23 is a cross-sectional view of a modified example of the display device 10 illustrated in FIG. 3.

Figure 18:
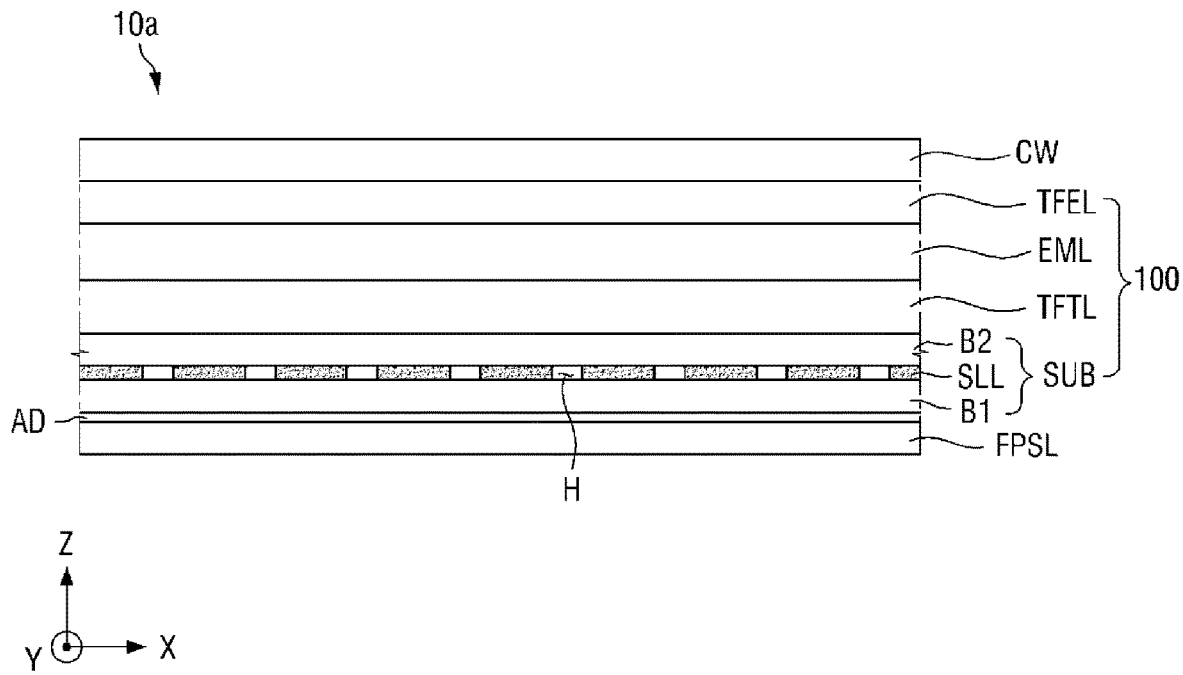

Referring to FIG. 18, a display device 10a according to the current embodiment is substantially the same as the display device 10 according to the embodiment of FIG. 3 except that a bonding layer AD is further located between a fingerprint recognition sensor layer FPSL and a display panel 100, and the fingerprint recognition sensor layer FPSL and the display panel 100 are bonded together by the bonding layer AD. Therefore, redundant description thereof will not be repeated here.

The bonding layer AD may directly contact (e.g., physically contact) a lower surface of the display panel 100 and an upper surface of the fingerprint recognition sensor layer FPSL. In some embodiments, the bonding layer AD may include an optically clear adhesive material. For example, the bonding layer AD may be made of a pressure sensitive adhesive and may be optically clear.

The fingerprint recognition sensor layer FPSL and the display panel 100 may be bonded together by the bonding layer AD. In some embodiments, no air gap may be formed between the fingerprint recognition sensor layer FPSL and the display panel 100.

Figure 19:
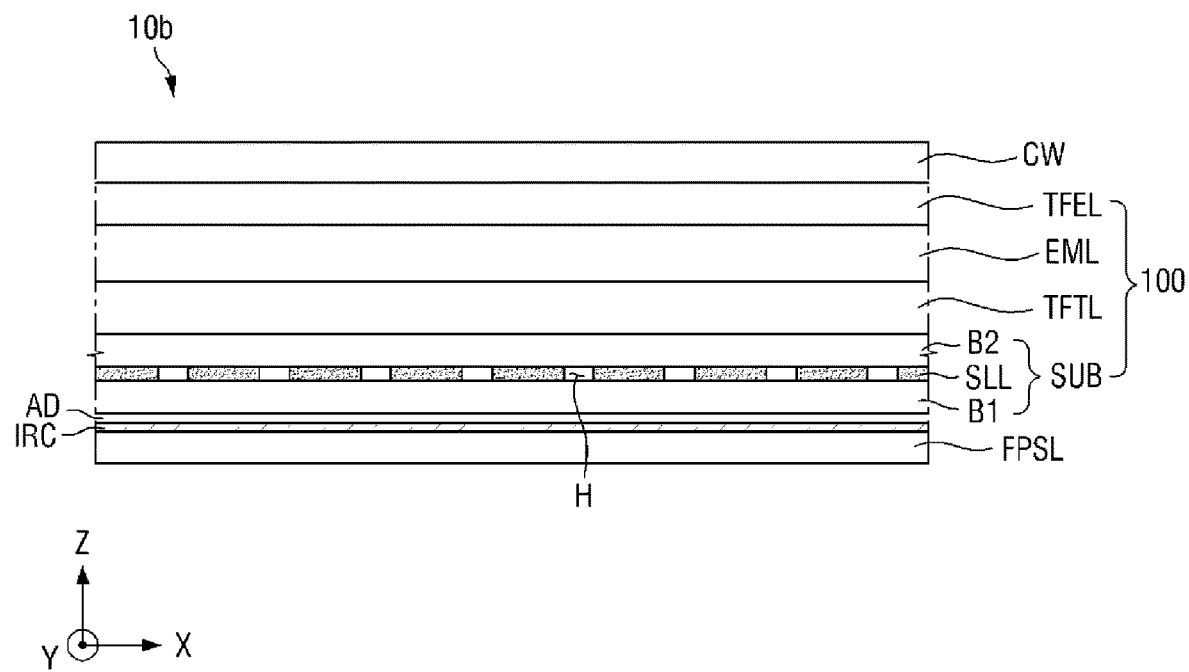

Referring to FIG. 19, a display device 10b according to the current embodiment may be substantially the same as the display device 10a according to the embodiment of FIG. 18 except that an infrared blocking filter layer IRC is further located between a bonding layer AD and a fingerprint recognition sensor layer FPSL.

The infrared blocking filter layer IRC may pass light in wavelength bands shorter than a set (e.g., predetermined) wavelength band among light incident on the fingerprint recognition sensor layer FPSL. For example, the infrared blocking filter layer IRC may block or reduce transmission of light in an infrared wavelength band and transmit light in a visible wavelength band and light in an ultraviolet wavelength band. In some embodiments, the infrared blocking filter layer IRC may further block light in a red wavelength band and light in a near infrared wavelength band. For example, the infrared blocking filter layer IRC may block light having a wavelength of about 600 nanometers or more. Because light passing through the infrared blocking filter layer IRC is transmitted to the fingerprint recognition sensor layer FPSL, the fingerprint recognition sensor layer FPSL may not receive light in the infrared wavelength band or light in the red and near infrared wavelength bands.

In some embodiments, the infrared blocking filter layer IRC may be attached onto the fingerprint recognition sensor layer FPSL by a bonding member. In some embodiments, the infrared blocking filter layer IRC may be formed by coating an infrared blocking material directly on the fingerprint recognition sensor layer FPSL.

According to the current embodiment, because light in the infrared wavelength band can be blocked or reduced using the infrared blocking filter layer IRC, an occurrence of a recognition error of the fingerprint recognition sensor layer FPSL due to the light in the infrared wavelength band among external light such as sunlight can be prevented or reduced.

In addition, it is possible to prevent or reduce the generation of a leakage current in fingerprint recognition sensors FPS included in the fingerprint recognition sensor layer FPSL due to the light in the infrared wavelength band.

The bonding layer AD may directly contact (e.g., physically contact) a lower surface of a display panel 100 and an upper surface of the infrared blocking filter layer IRC.

In some embodiments, the bonding layer AD and the infrared blocking filter layer IRC may be located between the fingerprint recognition sensor layer FPSL and the display panel 100, but no (or substantially no) air gap may be formed.

Figure 20:
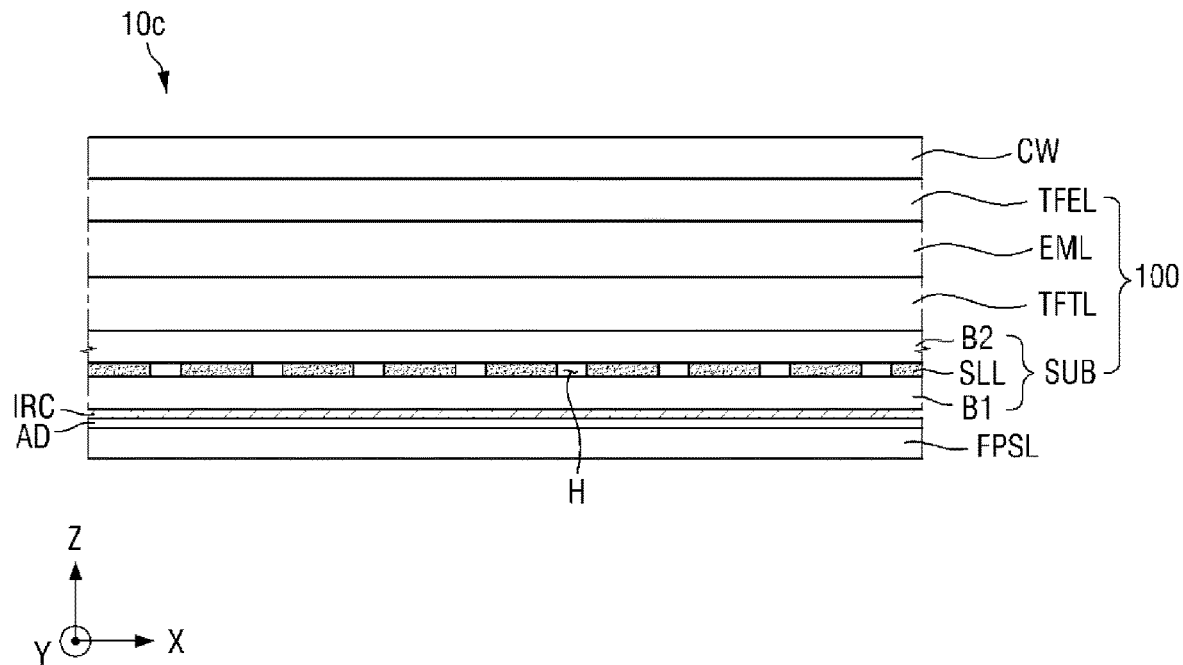

Referring to FIG. 20, a display device 10c according to the current embodiment may be substantially the same as the display device 10b according to the embodiment of FIG. 19 except that an infrared blocking filter layer IRC is located between a bonding layer AD and a display panel 100.

In the current embodiment, the infrared blocking filter layer IRC may be attached to a lower surface of the display panel 100 by a bonding member. In some embodiments, the infrared blocking filter layer IRC may be formed by coating an infrared blocking material directly on the lower surface of the display panel 100.

The bonding layer AD may directly contact (e.g., physically contact) a lower surface of the infrared blocking filter layer IRC and an upper surface of a fingerprint recognition sensor layer FPSL.

In some embodiments, the bonding layer AD and the infrared blocking filter layer IRC may be located between the fingerprint recognition sensor layer FPSL and the display panel 100, but no (or substantially no) air gap may be formed.

Figure 21:
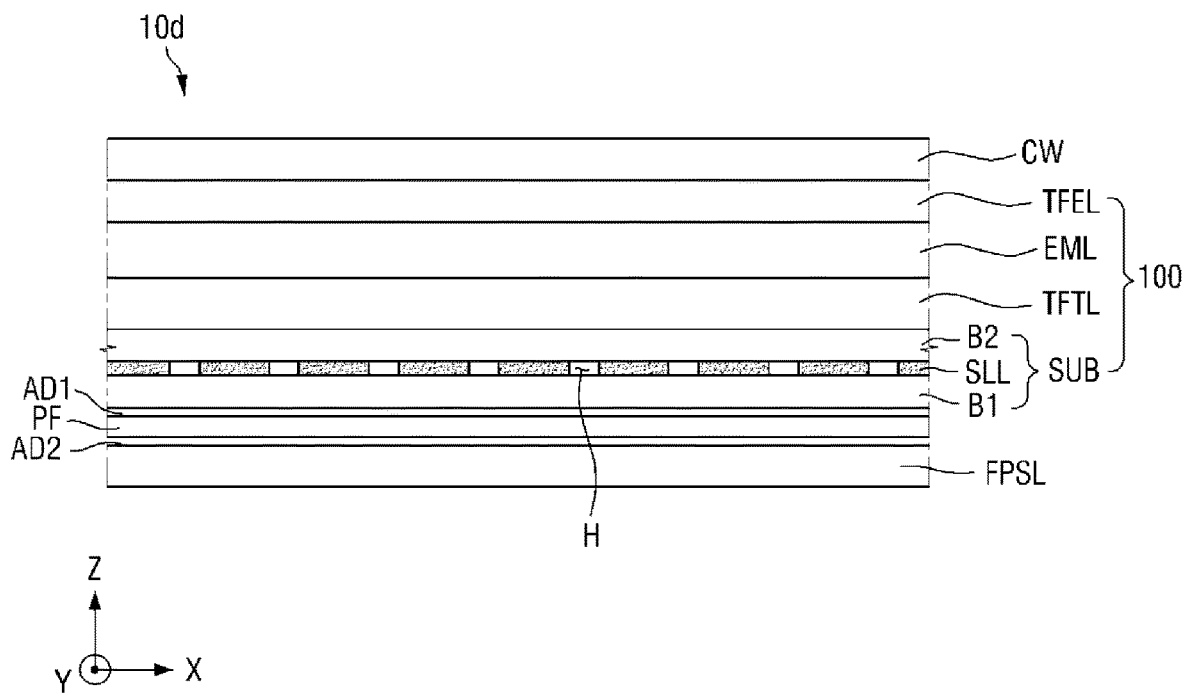

Referring to FIG. 21, a display device 10d according to the current embodiment is substantially the same as the display device 10 according to the embodiment of FIG. 3 except that a protective member PF is further located between a display panel 100 and a fingerprint recognition sensor layer FPSL, a first bonding layer AD1 is further located between the protective member PF and the display panel 100, and a second bonding layer AD2 is further located between the fingerprint recognition sensor layer FPSL and the protective member PF.

The protective member PF may protect the display panel 100. The protective member PF may be boned to a lower surface of the display panel 100 by the first bonding layer AD1.

In some embodiments, when the display panel 100 has flexibility or when a base substrate SUB has flexibility, the protective member PF may suppress or reduce sagging of the display panel 100 or sagging of the base substrate SUB.

In some embodiments, the protective member PF may have certain rigidity to support the display panel 100 and flexibility to allow folding or bending of the display panel 100. The protective member PF may be made of a plastic material having certain flexibility and light transmitting properties. For example, the protective member PF may be made of polyurethane (PU), polyimide (PI), and/or polyethylene terephthalate (PET).

The fingerprint recognition sensor layer FPSL may be bonded to the protective member PF by the second bonding layer AD2.

The first bonding layer AD1 and the second bonding layer AD2 may include an optically clear adhesive material. For example, the first bonding layer AD1 and the second bonding layer AD2 may be made of a pressure sensitive adhesive and may be optically clear.

The first bonding layer AD1 may directly contact (e.g., physically contact) the lower surface of the display panel 100 and an upper surface of the protective member PF, and the second bonding layer AD2 may directly contact (e.g., physically contact) a lower surface of the protective member PF and an upper surface of the fingerprint recognition sensor layer FPSL.

In some embodiments, the first bonding layer AD1, the protective member PF and the second bonding layer AD2 may be located between the fingerprint recognition sensor layer FPSL and the display panel 100, but no (or substantially no) air gap may be formed.

Figure 22:
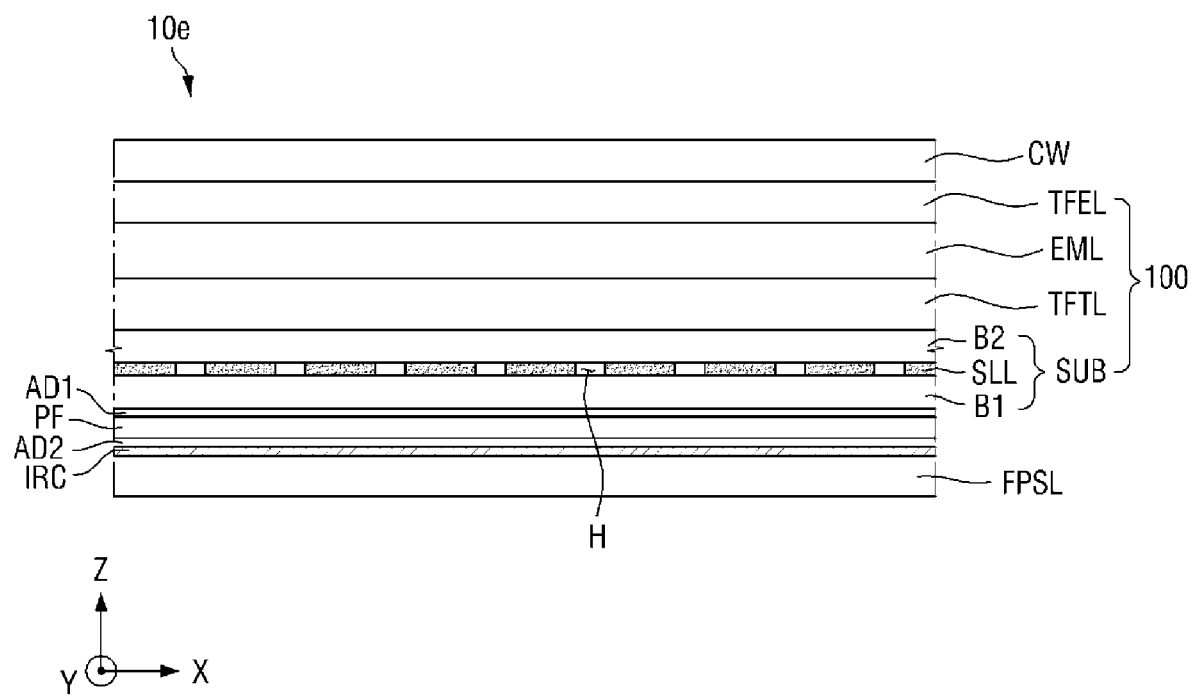

Referring to FIG. 22, a display device 10e according to the current embodiment is substantially the same as the display device 10d according to the embodiment of FIG. 21 except that an infrared blocking filter layer IRC is further located between a second bonding layer AD2 and a fingerprint recognition sensor layer FPSL. Other details of the infrared blocking filter layer IRC are substantially the same as or similar to those described herein above in the embodiment of FIG. 19, and thus, a redundant description thereof is not repeated here.

A first bonding layer AD1 may directly contact (e.g., physically contact) a lower surface of a display panel 100 and an upper surface of a protective member PF, and the second bonding layer AD2 may directly contact (e.g., physically contact) a lower surface of the protective member PF and an upper surface of the infrared blocking filter layer IRC.

In some embodiments, the first bonding layer AD1, the protective member PF, the second bonding layer AD2, and the infrared blocking filter layer IRC may be located between the fingerprint recognition sensor layer FPSL and the display panel 100, but no (or substantially no) air gap may be formed.

Figure 23:
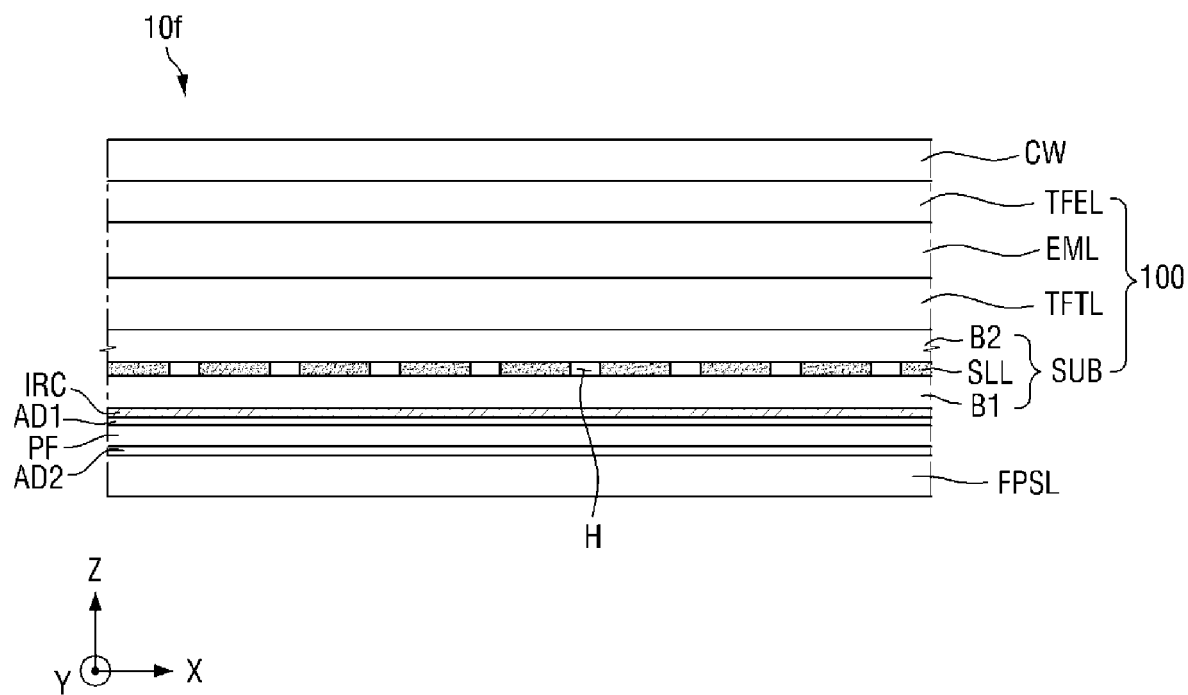

Referring to FIG. 23, a display device 10f according to the current embodiment is substantially the same as the display device 10d according to the embodiment of FIG. 21 except that an infrared blocking filter layer IRC is further located between a first bonding layer AD1 and a display panel 100. Other details of the infrared blocking filter layer IRC are substantially the same as or similar to those described herein above in the embodiment of FIG. 20, and thus, a redundant description thereof is not repeated here.

The first bonding layer AD1 may directly contact (e.g., physically contact) a lower surface of the infrared blocking filter layer IRC and an upper surface of a protective member PF, and a second bonding layer AD2 may directly contact (e.g., physically contact) a lower surface of the protective member PF and an upper surface of a fingerprint recognition sensor layer FPSL.

In some embodiments, the infrared blocking filter layer IRC, the first bonding layer AD1, the protective member PF, and the second bonding layer AD2 may be located between the fingerprint recognition sensor layer FPSL and the display panel 100, but no (or substantially no) air gap may be formed.

A display device according to an embodiment recognizes a fingerprint using light output from a display panel. Therefore, the fingerprint can be recognized without a separate light source.

In addition, holes are formed in a light blocking layer in a substrate to form light passages, and a pitch of the holes is adjusted, thereby improving fingerprint recognition characteristics.

However, the effects of the embodiments are not restricted to the one set forth herein. The above and other effects of the embodiments will become more apparent to one of daily skill in the art to which the embodiments pertain by referencing the claims, and equivalents thereof.

Embodiments of the present disclosure have been described herein above with reference to the accompanying drawings, but those of ordinary skill in the art to which the present disclosure pertains should understand that the subject matter of the present disclosure may be practiced in other specific forms without changing the spirit or scope of the present disclosure. Therefore, the embodiments described herein above should be understood as being illustrative in all aspects instead of limiting.

What is claimed is:

1. A display device comprising:
   a display panel comprising a base substrate, a thin-film transistor layer including thin-film transistors on the base substrate, and a light emitting element layer comprising light emitting elements on the thin-film transistor layer, wherein the base substrate comprises a light blocking layer between a first base and a second base;
   a cover window on the light emitting element layer;
   a fingerprint recognition sensor layer under the second base;
   a protective member located between the second base and the fingerprint recognition sensor layer;
   a first bonding layer located between the second base and the protective member; and
   a second bonding layer located between the protective member and the fingerprint recognition sensor layer, and
   wherein the light blocking layer comprises holes through which light reflected by a finger touching the cover window passes,
   wherein the thin-film transistor layer is disposed on the first base,
   wherein the protective member is bonded to the display panel by the first bonding layer, and the fingerprint recognition sensor layer is bonded to the protective member by the second bonding layer, and
   wherein a material of the first base is the same as a material of the second base, and the first base and the second base each comprise a polymer material.

2. The display device of claim 1, wherein a pitch of the holes is about 1.3 to about 1.5 times a hole-sensor distance, and
   wherein the hole-sensor distance is a distance from a center point of any one of the holes to an upper surface of the fingerprint recognition sensor layer.

3. The display device of claim 2, wherein the holes comprise a first hole and a second hole,
   wherein the fingerprint recognition sensor layer comprises a first light receiving area which receives fingerprint patterns scanned by the reflected light through the first hole and a second light receiving area which receives fingerprint patterns scanned by the reflected light through the second hole, and
   wherein the first light receiving area and the second light receiving area do not overlap each other.

4. The display device of claim 3, wherein the first light receiving area and the second light receiving area contact each other.

5. The display device of claim 4, wherein the first light receiving area comprises a first image collecting area, and the second light receiving area comprises a second image collecting area, and
   wherein the first image collecting area and the second image collecting area are spaced apart from each other.

6. The display device of claim 5, wherein the first hole, the first image collecting area, and the first light receiving area overlap in a thickness direction.

7. The display device of claim 6, wherein the second hole, the second image collecting area, and the second light receiving area overlap in the thickness direction.

8. The display device of claim 2, wherein each of the holes has a diameter of about 3 μm to about 20 μm.

9. The display device of claim 2, wherein an angle at which the reflected light is incident on the holes is about −33 degrees to about 33 degrees.

10. The display device of claim 1, wherein a pitch of the holes is about 0.5 to about 1.2 times a hole-sensor distance, and
    wherein the hole-sensor distance is a distance from a center point of any one of the holes to an upper surface of the fingerprint recognition sensor layer.

11. The display device of claim 10, wherein the holes comprise a first hole and a second hole,
   wherein the fingerprint recognition sensor layer comprises a first light receiving area which receives fingerprint patterns scanned by the reflected light through the first hole and a second light receiving area which receives fingerprint patterns scanned by the reflected light through the second hole, and
   wherein the first light receiving area and the second light receiving area overlap each other.

12. The display device of claim 11, wherein the first light receiving area comprises a first image collecting area, and the second light receiving area comprises a second image collecting area, and
   wherein the first image collecting area and the second image collecting area are spaced apart from each other.

13. The display device of claim 12, wherein the first hole, the first image collecting area, and the first light receiving area overlap in the thickness direction.

14. The display device of claim 13, wherein the second hole, the second image collecting area, and the second light receiving area overlap in the thickness direction.

15. The display device of claim 14, wherein the first image collecting area and the second light receiving area do not overlap each other.

16. The display device of claim 15, wherein the second image collecting area and the first light receiving area do not overlap each other.

17. The display device of claim 1, wherein the light blocking layer comprises a first area and a second area,
   wherein a pitch of holes located in the first area is about 1.3 times a hole-sensor distance, and a pitch of holes located in the second area is about 0.5 to about 1.2 times the hole-sensor distance, and
   wherein the hole-sensor distance is a distance from a center point of any one of the holes to an upper surface of the fingerprint recognition sensor layer.

18. The display device of claim 17, wherein the holes located in each of the first area and the second area comprise a first hole and a second hole,
   wherein each of the first area and the second area comprises a first light receiving area which receives fingerprint patterns scanned by the reflected light through the first hole and a second light receiving area which receives fingerprint patterns scanned by the reflected light through the second hole, and
   wherein the first light receiving area and the second light receiving area included in the first area do not overlap each other, and the first light receiving area and the second light receiving area included in the second area overlap each other.

19. The display device of claim 18, wherein the first light receiving area included in each of the first area and the second area comprises a first image collecting area,
   wherein the second light receiving area included in each of the first area and the second area comprises a second image collecting area, and
   wherein the first image collecting area and the second image collecting area are spaced apart from each other.

20. The display device of claim 17, wherein each of the holes located in the first area and the second area has a diameter of about 3 µm to about 20 µm.

21. The display device of claim 1, further comprising an infrared blocking filter layer located between the display panel and the first bonding layer or between the fingerprint recognition sensor layer and the second bonding layer.

22. The display device of claim 1, further comprising an infrared blocking filter layer which is located between the display panel and the first bonding layer or between the fingerprint recognition sensor layer and the second bonding layer.

23. The display device of claim 1, wherein the light emitting element layer includes a first electrode, a light emitting layer disposed on the first electrode, a second electrode disposed on the light emitting layer, and a pixel defining layer covering an edge of the first electrode, and
   wherein the holes do not overlap thin-film transistors, and the holes overlap the pixel defining layer.

24. The display device of claim 1, wherein a plurality of sub-pixels are defined in the display panel, and
   wherein a sub-pixel among the plurality of sub-pixels includes a hole among the holes, and
   wherein an adjacent sub-pixel to the sub-pixel in one direction does not include any hole.

25. The display device of claim 1, wherein the fingerprint recognition sensor layer is an element of the display panel.

* * * * *